United States Patent [19]

Matsuoka et al.

[11] Patent Number: 5,759,050
[45] Date of Patent: Jun. 2, 1998

[54] ELECTRICAL CONNECTION CONSTRUCTION BETWEEN ELECTRICAL CONNECTION BOX AND ELECTRONIC CIRCUIT UNIT

[75] Inventors: Hideo Matsuoka; Takahiro Onizuka; Yuuji Saka, all of Yokkaichi, Japan

[73] Assignee: Sumitomo Wiring Systems, Ltd., Yokkaichi, Japan

[21] Appl. No.: 596,725

[22] Filed: Feb. 5, 1996

[30] Foreign Application Priority Data

| Feb. 15, 1995 | [JP] | Japan | 7-027028 |
| Feb. 20, 1995 | [JP] | Japan | 7-030734 |
| Feb. 20, 1995 | [JP] | Japan | 7-030736 |

[51] Int. Cl.[6] .................................................. H01R 9/09
[52] U.S. Cl. ................................................... 439/76.2
[58] Field of Search ......................... 439/76.2, 404, 439/949, 212, 290, 856, 857

[56] References Cited

U.S. PATENT DOCUMENTS

| 4,688,149 | 8/1987 | Inoue et al. . | |
| 4,944,684 | 7/1990 | Leibowitz | 439/76.2 |
| 4,959,019 | 9/1990 | Shimochi | 439/76.2 |
| 5,067,905 | 11/1991 | Matsumoto et al. | 439/76.2 |
| 5,174,782 | 12/1992 | Bogiel et al. . | |
| 5,295,842 | 3/1994 | Ozaki et al. . | |
| 5,295,858 | 3/1994 | Kasai et al. . | |
| 5,478,244 | 12/1995 | Mave et al | 439/76.2 |

FOREIGN PATENT DOCUMENTS

| 520284 | 12/1992 | European Pat. Off. . |
| 550855 | 7/1993 | European Pat. Off. . |
| 62-5683 | 1/1987 | Japan . |

Primary Examiner—Neil Abrams
Assistant Examiner—Yong Ki Kim
Attorney, Agent, or Firm—Greenblum & Bernstein P.L.C.

[57] ABSTRACT

An electrical connection construction between an electrical connection box and an electronic circuit unit, comprising: a plurality of bus bars which are provided in the electrical connection box and each include a first tab; and a plurality of terminals which are provided in the electronic circuit unit and a front end of each of which is inserted into a front end of the first tab of each of the bus bars of the electrical connection box so as to be connected to the first tab of each of the bus bars of the electrical connection box; wherein the front end of each of the terminals is formed into a second tab and the first tab of each of the bus bars of the electrical connection box and the second tab of each of the terminals of the electronic circuit unit are provided so as to orthogonally intersect with each other; wherein a pressing contact slit is formed at a front end of one of the first and second tabs so as to receive a front end of the other of the first and second tabs.

18 Claims, 20 Drawing Sheets

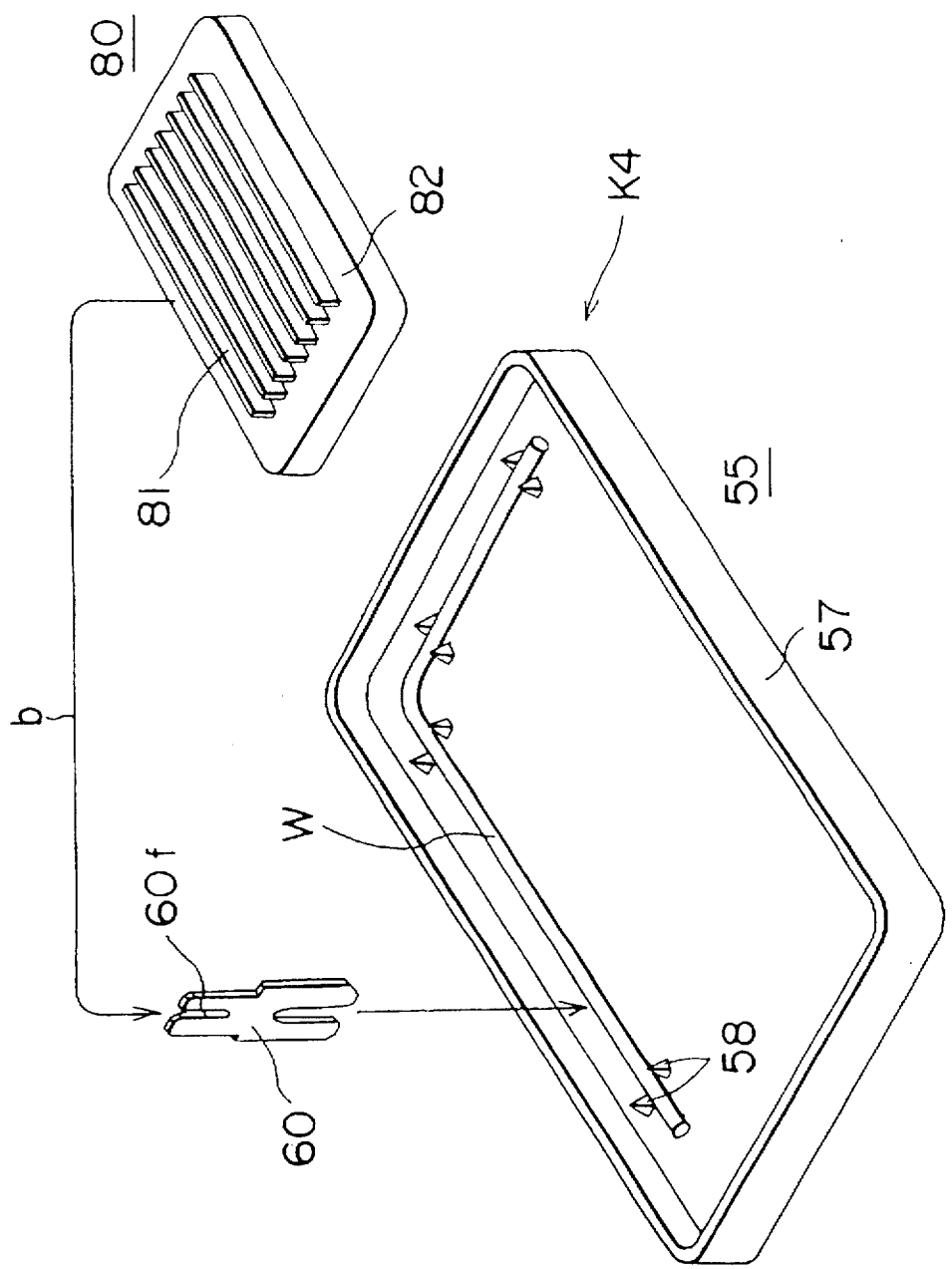

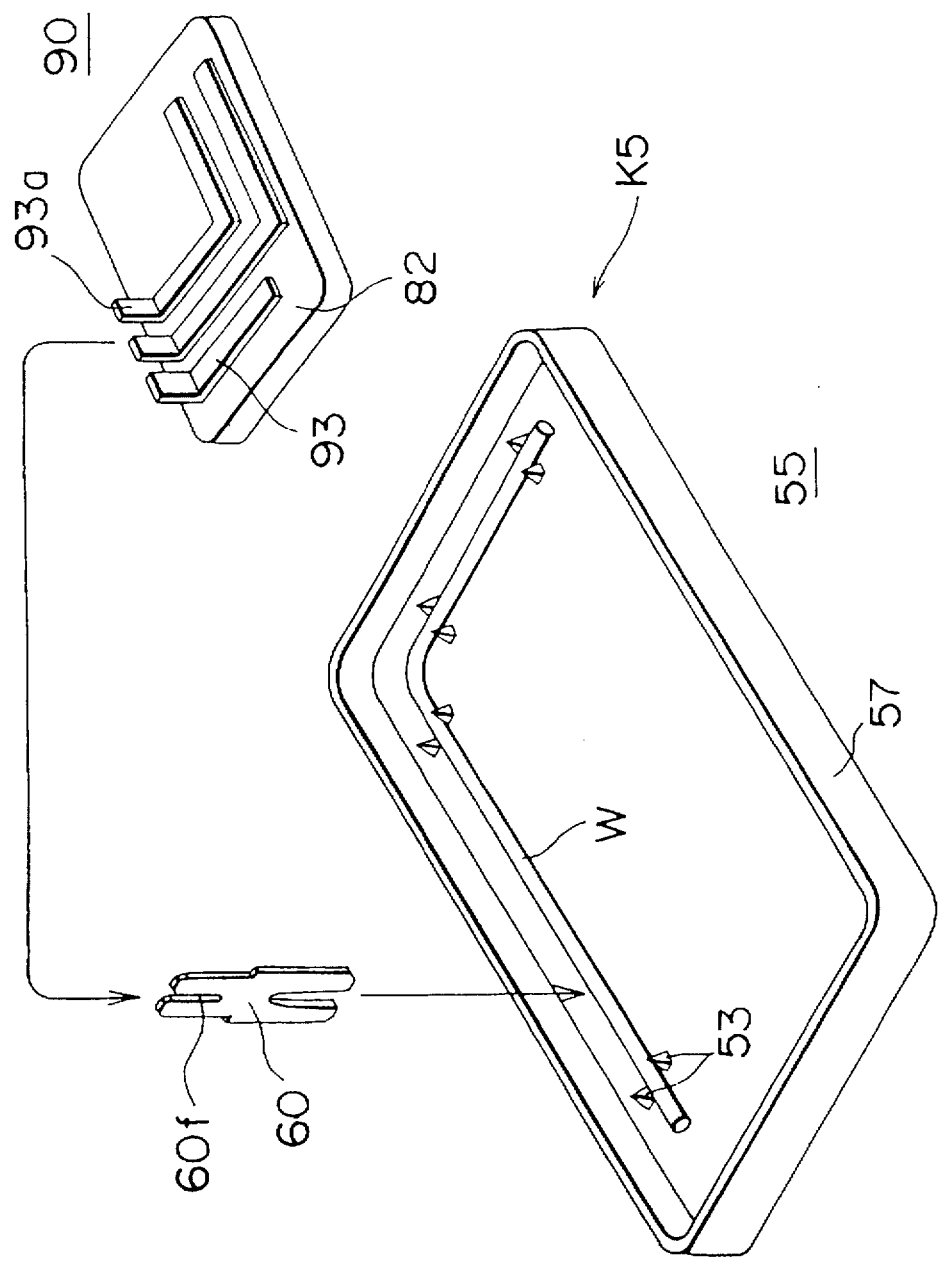

5,759,050

ELECTRICAL CONNECTION CONSTRUCTION BETWEEN ELECTRICAL CONNECTION BOX AND ELECTRONIC CIRCUIT UNIT

BACKGROUND OF THE INVENTION

The present invention generally relates to electrical connection between an electrical connection box and an electronic circuit unit, in which a female terminal of the electronic circuit unit is connected to a tab of a bus bar or a pressing contact terminal of the electrical connection box through insertion of the tab into the female terminal and more particularly, to an electrical connection construction between the electrical connection box and the electronic circuit unit, which can be produced at low cost.

In electrical connection boxes used for connecting wiring harnesses for motor vehicles to various electric devices, a branching connection point is concentrated at one spot such that branching connection of wires is performed reasonably and economically. In response to recent trends towards higher density of the wiring harnesses, various types of electrical connection boxes have been developed for different models of the motor vehicles and different applications.

FIGS. 1 to 3 show a known electrical connection box 1. The known electrical connection box 1 includes an upper cover 2 and a lower cover 3. A unit receiver 2a for receiving a prior art electronic circuit unit 4 is projected from an upper face of the upper cover 2 and a connector receiver 2b for receiving a connector housing 5 of the prior art electronic circuit unit 4 is protruded from a bottom of the unit receiver 2a. In a space defined between the upper cover 2 and the lower cover 3, a plurality of bus bars 7 are stacked on each other through a pair of insulating plates 6. A plurality of flat platelike tabs 7a are bent from the bus bars 7 so as to project into the connector receiver 2b from slits 2c formed on the upper face of the upper cover 2, respectively.

As shown in FIGS. 4 and 5, the prior art electronic circuit unit 4 includes an upper cover 8 and a lower cover 9. The upper cover 8 is placed on the lower cover 9 and then, locking claws 9 of the lower cover 9 are brought into engagement with locking openings 8a of the upper cover 8, respectively such that the upper cover 8 is locked to the lower cover 9. A printed circuit board 10 having a circuit 10a formed on its lower face adjacent to the lower cover 9 is accommodated in a space defined between the upper cover 8 and the lower cover 9. A rear end 11a of a terminal 11 is inserted into a slit lob formed on an upper face of the printed circuit board 10 adjacent to the upper cover 8 so as to be joined to the circuit 10a of the printed circuit board 10 by solder a or the like. A front end of the terminal 11 is bent into a female electrical connector 11b by a press or the like. A semicircular spring portion lid is formed at an intermediate portion of the terminal 11 so as to absorb force applied to the solder a at the time the tab 7a of the bus bar 7 is inserted into the female electrical connector 11b of the terminal 11.

The female electrical connector 11b of the terminal 11 is projected into the connector housing 5 of the prior art electronic circuit unit 4 and is retained at a predetermined position through engagement of a lance portion 5a of the connector housing 5 with a slot 11c of the female electrical connector 11b. Subsequently, when the upper cover 8 of the prior art electronic circuit unit 4 is turned upside down and then, the prior art electronic circuit unit 4 is fitted into the unit receiver 2a of the electrical connection box 1 from above as shown by the arrow b in FIG. 1, the connector housing 5 of the prior art electronic circuit unit 4 is fitted into the connector receiver 2b of the electrical connection box 1 from above and thus, a corresponding one of the tabs 7a of the bus bars 7 is inserted into the female electrical connector 11b of the terminal 11 so as to be electrically connected to the terminal 11 as shown in FIG. 3.

However, the prior art electronic circuit unit 4 has such a drawback that since the female electrical connector 11b of the terminal 11 of the prior art electronic circuit unit 4 should be formed by bending employing a press or the like, production cost of the prior art electronic circuit unit 4 rises.

Meanwhile, since the prior art electronic circuit unit 4 is required to be provided with the upper cover 8, the lower cover 9, the connector housing 5, etc., production cost of the prior art electronic circuit unit 4 is further raised undesirably.

Furthermore, an electrical connection construction between an electrical connection box 1' and the electronic circuit unit 4 is known in which one of internal circuits of the electrical connection box and the electronic circuit unit is constituted by a wire and a pressing contact terminal brought into pressing contact with the wire such that the pressing contact terminal is electrically connected to a terminal of an electrically conductive metal plate of the other of the internal circuits of the electrical connection box and the electronic circuit unit directly without using a relay terminal, etc. as shown in FIGS. 6 and 7. As shown in FIGS. 6 and 7, the electrical connection box 1' includes the upper cover 2 and the lower cover 3. Furthermore, in FIGS. 6 and 7, an internal circuit of the electrical connection box 1' is constituted by a wire W and a pressing contact terminal 17 brought into pressing contact with the wire W. The pressing contact terminal 17 has a tab 17a acting as a male terminal to be connected to an external terminal and the tab 17a is projected into the connector receiver 2b from the slit 2c.

When the upper cover 8 of the prior art electronic circuit unit 4 is turned upside down and then, the prior art electronic circuit unit 4 is fitted into the unit receiver 2a from above, the connector housing 5 of the electronic circuit unit 4 is fitted into the connector receiver 2b of the known electrical connection box 1' from above, so that the tab 17a of the pressing contact terminal 17 of the known electrical connection box 1' is inserted into the female electrical connector 11b of the terminal 11 so as to be electrically connected to the terminal 11.

Meanwhile, in case a portion of the internal circuit of the known electrical connection box 1' is constituted by a wire and a pressing contact terminal and the remaining portion of the internal circuit of the known electrical connection box 1' is constituted by a bus bar 12 formed by an electrically conductive metal plate as shown in FIG. 8, the bus bar 12 usually has a tab 12a acting as a male terminal. Therefore, a relay terminal 13 is required to be used for connecting the tab 12a of the bus bar 12 to the tab 17a of the pressing contact terminal 17. However, if the relay terminal 13 is employed, such problems arise that the known electrical connection box 1' becomes large in size due to large space occupied by the internal circuit of the known electrical connection box 1' and the number of components of the known electrical connection box increases.

In order to eliminate the need for the relay terminal 13, a pressing contact terminal 17' should have a female terminal portion 17b to be connected to an external terminal as shown in FIG. 9. In this case, the pressing contact terminal 17' is made complicated structurally, thereby resulting in rise of production cost of the pressing contact terminal 17', namely, the known electrical connection box 1'.

SUMMARY OF THE INVENTION

Accordingly, a first object of the present invention is to provide, with a view to eliminating the above mentioned inconveniences of conventional electrical connection constructions between an electrical connection box and an electronic circuit unit, an electrical connection construction between an electrical connection box and an electronic circuit unit, which can be produced at low cost.

A second object of the present invention is to provide an electrical connection construction between an electrical connection box and an electronic circuit unit, in which an internal circuit of the electrical connection box is constituted by a wire and a pressing contact terminal brought into pressing contact with the wire such that not only a relay terminal is not required to be used for connecting the pressing contact terminal to an electrically conductive metal plate such as a bus bar or the like but shapes of the pressing contact terminal and the electrically conductive metal plate are simplified.

In order to accomplish the first object of the present invention, an electrical connection construction between an electrical connection box and an electronic circuit unit, according to the present invention comprises: a plurality of bus bars which are provided in the electrical connection box and each include a first tab; and a plurality of terminals which are provided in the electronic circuit unit and a front end of each of which is inserted into a front end of the first tab of each of the bus bars of the electrical connection box so as to be connected to the first tab of each of the bus bars of the electrical connection box; wherein the front end of each of the terminals is formed into a second tab and the first tab of each of the bus bars of the electrical connection box and the second tab of each of the terminals of the electronic circuit unit are provided so as to orthogonally intersect with each other; wherein a pressing contact slit is formed at a front end of one of the first and second tabs so as to receive a front end of the other of the first and second tabs.

It is preferable that the pressing contact slit is formed at the front end of the first tab of each of the bus bars of the electrical connection box.

In the present invention, since each of the terminals of the electronic circuit unit is formed into the second tab similar to the first tab of each of the bus bars of the electrical connection box and the pressing contact slit is formed at the front end of one of the first and second tabs, for example, the first tab of the electrical connection box, the front end of the second tab of the electronic circuit unit can be orthogonally inserted into the pressing contact slit of the first tab so as to be connected to the first tab.

Therefore, since the tabs of the bus bars of the electrical connection box and the pressing contact slits of the tabs of the bus bars can be produced by conventional processes, production cost of the bus bars of the electrical connection box is not raised. Furthermore, material cost and production cost of the tab of the terminal of the electronic circuit unit is lowered greatly in comparison with a female electrical connector of a terminal obtained by bending with a press or the like in a known electronic circuit unit.

Meanwhile, the electronic circuit unit may be formed by a printed circuit board such that a pair of leg portions provided at a rear end of each of the terminals are joined to a circuit formed on the printed circuit board. Thus, the electronic circuit unit formed by the printed circuit board is provided together with the bus bars in a space defined between an upper cover and a lower cover of the electrical connection box. As a result, since the electronic circuit unit does not require an upper cover and a lower cover provided in a prior art outer mounting type electronic circuit unit, the number of components of the electronic circuit unit can be reduced, so that the number of assembly steps of the electronic circuit unit is also reduced and thus, production cost of the electronic circuit unit is lowered materially. Furthermore, if a pair of the leg portions of each of the terminals are joined to the printed circuit board of the electronic circuit unit by solder or the like, each of the terminals can be brought into alignment with the pressing contact slit of the tab of each of the bus bars and thus, a hitherto necessary connector housing for bringing the terminal of the electronic circuit unit into alignment with the tab of each of the bus bars of the electrical connection box can be eliminated.

Moreover, in order to accomplish the second object of the present invention, an electrical connection construction between an electrical connection box and an electric device, according to the present invention comprises: a first circuit which is provided for the electrical connection box; and a second circuit which is provided for the electric device so as to be connected to the first circuit; wherein one of the first and second circuits is constituted by a wire and a plurality of pressing contact terminals brought into pressing contact with the wire, while the other of the first and second circuits is constituted by a plurality of electrically conductive metal plates such that the pressing contact terminals are connected to the electrically conductive metal plates, respectively; wherein each of the pressing contact terminals has a tab to be connected to an external terminal and a pressing contact slit is formed at a front end of the tab; wherein a flat platelike terminal portion is provided on each of the electrically conductive metal plates so as to orthogonally intersect with each of the pressing contact terminals and is inserted into the pressing contact slit of each of the pressing contact terminals so as to be connected to each of the pressing contact terminals.

In this electrical connection construction, since the terminal provided at each of the electrically conductive metal plate may be formed into a flat platelike shape so as to be not only inserted into the pressing contact slit of each of the pressing contact terminals but brought into pressing contact with each of the pressing contact terminals, shape of the terminal of each of the electrically conductive metal plates can be simplified remarkably. Meanwhile, the tab of each of the pressing contact terminals may be merely formed with the pressing contact slit, the pressing contact terminals can be produced by conventional processes and thus, production cost of the pressing contact terminals is not raised.

For example, the electric device is formed by an electronic circuit unit and the second circuit of the electronic circuit unit is constituted by the electrically conductive metal plates fixed to and projecting from a circuit formed on a printed circuit board of the electronic circuit unit. The electrically conductive metal plates may be fixed to the circuit of the printed circuit board by various procedures such as soldering, ultrasonic welding and electric resistance welding. Meanwhile, it is preferable that the metal plates fixed to the circuit of the printed circuit board are formed by simple rectangular metal pieces and thickness of each of the metal pieces is set such that the metal piece can be not only inserted into the pressing contact slit of the tab of each of the pressing contact terminals but brought into pressing contact with the tab of each of the pressing contact terminals. A pair of leg portions may also be provided on one end face of each of the metal pieces and inserted into insertion holes formed on the printed circuit board so as to be soldered to the printed circuit board.

In the above mentioned electrical connection construction, each of the terminals of the electronic circuit unit may be formed into a simple flat platelike shape and thus, can be simplified in shape in comparison with a known terminal having a female electrical connector bent with a press or the like. In addition, since each of the electrically conductive metal plates fixed to the printed circuit board is directly connected to each of the pressing contact terminals of the electrical connection box, the electronic circuit unit can be accommodated in a casing of the electrical connection box. As a result, since the electronic circuit unit does not require an upper cover and a lower cover provided in a conventional outer mounting type electronic circuit unit, the number of components of the electronic circuit unit is reduced, so that the number of assembly steps of the electronic circuit unit can be also reduced.

Meanwhile, in case the electric device is formed by a further electrical connection box and the second circuit of the further electrical connection box is constituted by a plurality of bus bars, the flat platelike terminal portion is provided on each of the bus bars. The bus bars are each formed by an elongated rectangular metal plate and are disposed in the electrical connection box such that a pair of opposite sides of each of the bus bars are oriented vertically. Furthermore, if each of the bus bars is formed into a flat platelike terminal and thickness of each of the bus bars is set such that each of the bus bars can be not only inserted into the pressing contact slit of each of the pressing contact terminals but brought into pressing contact with each of the pressing contact terminals, the pressing contact terminal can be electrically connected to an arbitrary position of each of the elongated bus bars. Alternatively, the bus bars may be disposed horizontally in the electrical connection box and each of the bus bars is bent at its predetermined location into a tab acting as the above mentioned flat platelike tab. In the pressing contact terminal, the tab having the pressing contact slit may be disposed in the same plane as a pressing contact portion having a pressing contact blade brought into pressing contact with the wire or may be bent orthogonally from the pressing contact portion.

In the above described electrical connection construction, a hitherto necessary relay terminal for connecting the pressing contact terminal and the bus bar can be eliminated and it is possible to eliminate a female electrical connector formed conventionally on the pressing contact terminal in place of the relay terminal.

BRIEF DESCRIPTION OF THE DRAWINGS

These objects and features of the present invention will become apparent from the following description taken in conjunction with preferred embodiments thereof with reference to the accompanying drawings, in which:

FIG. 24 is an exploded perspective view of an electrical connection construction between two electrical connection boxes, according to a fourth embodiment of the present invention; and FIG. 25 is an exploded perspective view of an electrical connection construction between two electrical connection boxes, according to a fifth embodiment of the present invention.

Before the description of the present invention proceeds, it is to be noted that like parts are designated by like reference numerals throughout several views of the accompanying drawings.

DETAILED DESCRIPTION OF THE INVENTION

Figure 10:
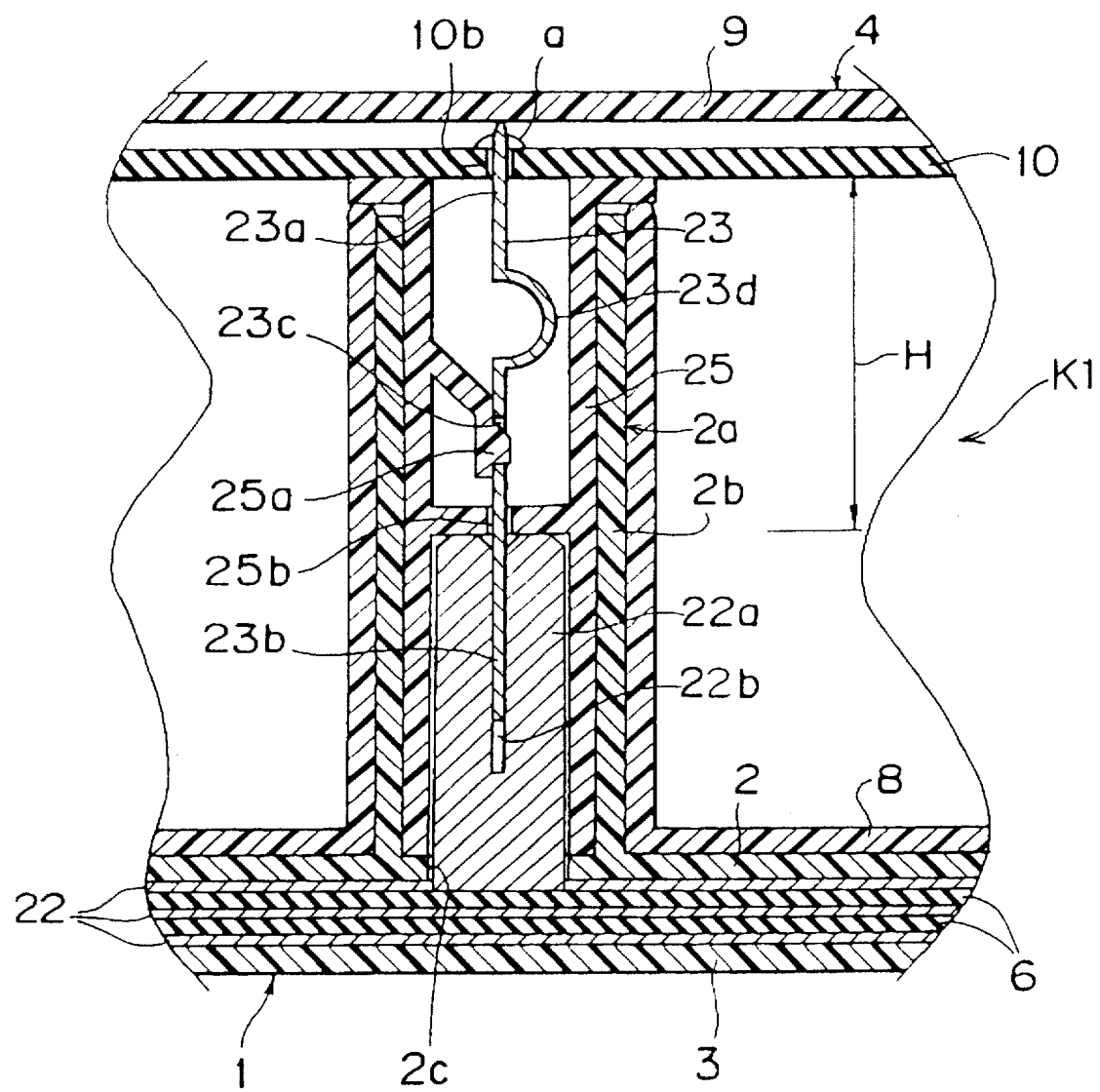
FIG. 10 is a fragmentary sectional view of an electrical connection construction between an electrical connection box and an electronic circuit unit, according to a first embodiment of the present invention.

Referring now to the drawings, there is shown in FIGS. 10 to 13, an electrical connection construction K1 between an electrical connection box 1 and an electronic circuit unit 4, according to a first embodiment of the present invention. As shown in FIG. 10, the electrical connection box 1 includes an upper cover 2 and a lower cover 3 and a plurality of bus bars 22 are stacked on each other through a pair of insulating plates 6 in a space defined between the upper cover 2 and the lower cover 3. A plurality of flat platelike tabs 22a are projected from the bus bars 22 into a connector receiver 2b through slits 2c formed on an upper face of the upper cover 2.

Figure 2:
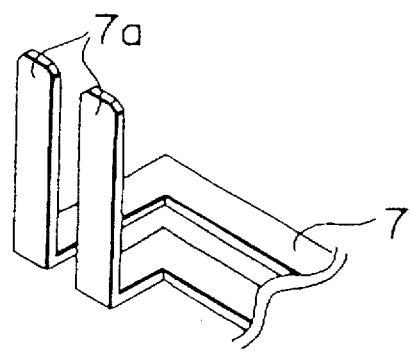
FIG. 2 is a fragmentary perspective view of tabs of bus bars employed in the prior art electrical connection box of FIG. 1 (already referred to)
Figure 11:
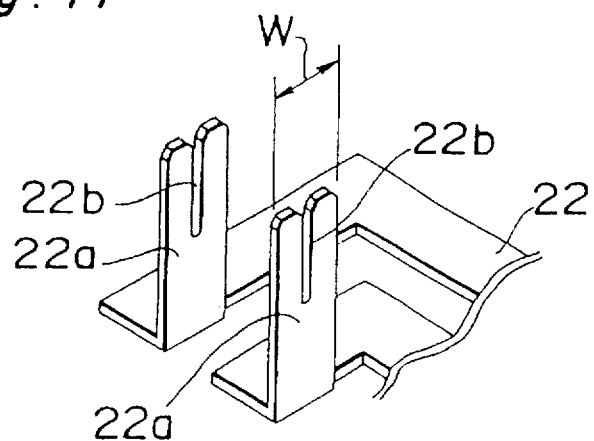
FIG. 11 is a perspective view of tabs of bus bars employed in the electrical connection box of FIG. 10.

As shown in detail in FIG. 11, a width W of each of the tabs 22a is about 1.5 times as large as that of a tab 7a of a prior art bus bar 7 shown in FIG. 2 and is angularly shifted through 90° from the tab 7a of the prior art bus bar 7. A vertically extending pressing contact slit 22b is formed at a distal end of each of the tabs 22a.

The electronic circuit unit 4 includes an upper cover 8, a lower cover 9 and a printed circuit board 10 accommodated in a space defined between the upper cover 8 and the lower cover 9. A circuit 10b is formed on a lower face of the printed circuit board 10, while a slit 10b is formed on an upper face of the printed circuit board 10. A rear end 23a of a terminal 23 is inserted into the slit 10b of the printed circuit board 10 so as to be joined to the circuit 10a by solder a or the like.

Figure 5:
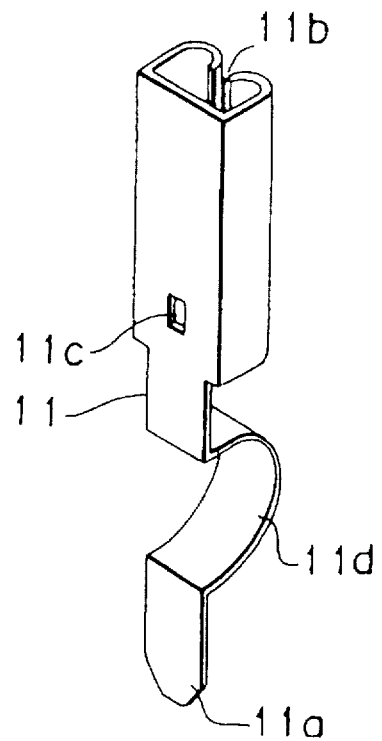
FIG. 5 is a perspective view of a terminal employed in the prior art electronic circuit unit of FIG. 4 (already referred to)
Figure 3:
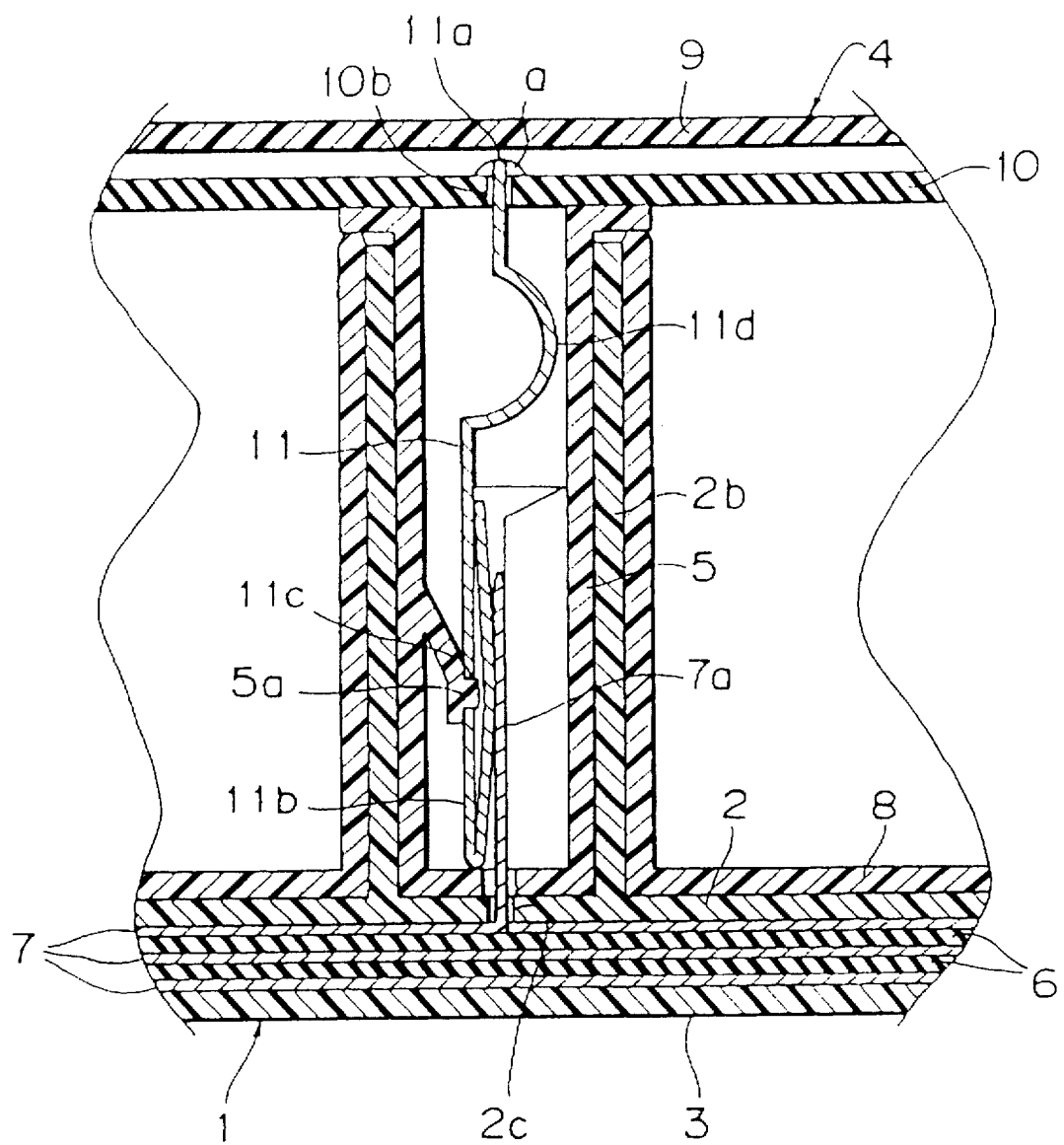
FIG. 3 is a fragmentary sectional view showing the prior art electrical connection box of FIG. 1 and the prior art electronic circuit unit of FIG. 1 after their connection (already referred to)
Figure 12:
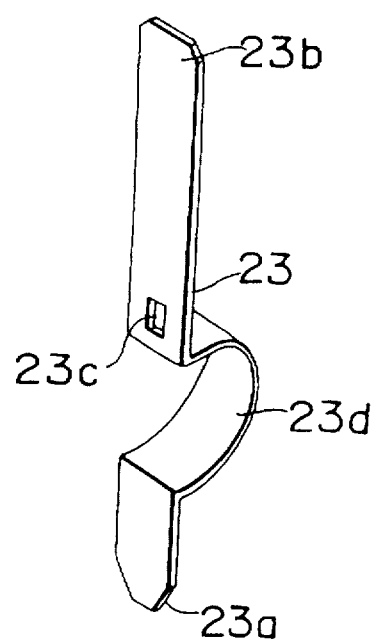
FIG. 12 is a perspective view of a terminal employed in the electronic circuit unit of FIG. 10.
Figure 13:
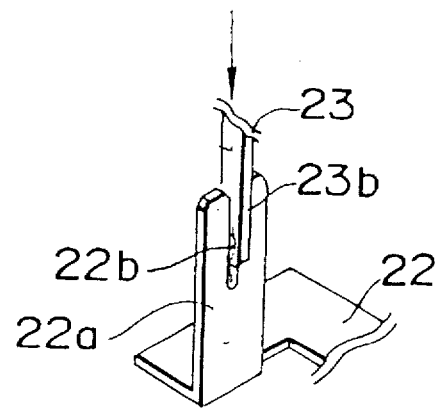
FIG. 13 is a perspective view showing insertion of a tab of the terminal of FIG. 12 into a pressing contact slit of the tab of the bus bar of FIG. 11.

As clearly shown in FIG. 12, the terminals 23 is not provided with a female electrical connector 11b obtained by bending a front end of a prior art terminal 11 of FIG. 5 with a press or the like but has a flat platelike tab 23b similar to the tabs 22a of the bus bars 22. The tab 23b of the terminal 23 is so disposed as to orthogonally intersect with the tabs 22a of the bus bars 22. A semicircular spring portion 23d is formed at an intermediate portion of the terminal 23 so as to absorb force applied to the solder a at the time the tab 23b of the terminal 23 is inserted into the pressing contact slit 22b of the tab 22a of the bus bar 22 so as to be connected to the bus bar 22. The terminal 23 is retained at a predetermined position through engagement of a lance portion 25a of a connector housing 25 of the electronic circuit unit 4 with a slot 23c formed on the terminal 23.

Figure 1:
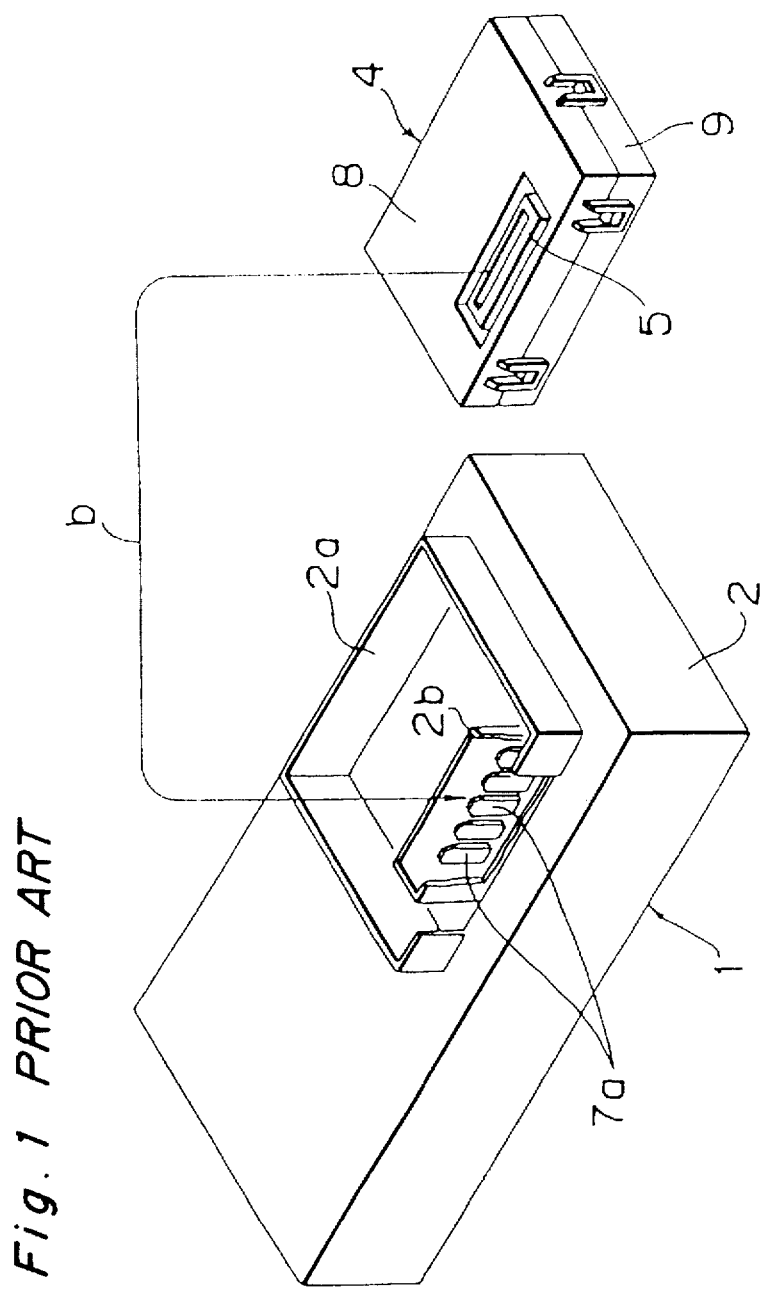
FIG. 1 is a perspective view showing a prior art electrical connection box and a prior art electronic circuit unit prior to their connection (already referred to)

In the above described electrical connection construction K1, when the upper cover 8 of the electronic circuit unit 4 is turned upside down and then, the electronic circuit unit 4 is fitted into a unit receiver 2a of the electrical connection box 1 from above in a manner similar to that of FIG. 1 as shown by the arrow b, the connector housing 25 of the electronic circuit unit 4 is fitted into the connector receiver 2b of the electrical connection box 1 from above. As a result, a distal end portion of the tab 23b of the terminal 23 of the electronic circuit unit 4 is inserted into the pressing contact slit 22b of the tab 22a of the bus bar 22 orthogonally to the tab 22a of the bus bar 22 so as to be connected to the tab 22a of the bus bar 22 as shown in FIG. 10.

Since the tab 22a and the pressing contact slit 22b of the bus bar 22 can be produced by conventional processes, production cost of the bus bar 22 is not raised. Meanwhile, since the tab 23b of the terminal 23 of the electronic circuit unit 4 is not required to be bent by a press or the like in contrast with the female electrical connector 11b of the prior art terminal 11 shown in FIG. 5, material cost and production cost of the terminal 23 is lowered a great deal in comparison with the prior art terminal 11.

In the above described first embodiment, the pressing contact terminal 22b is formed at the tab 22a of the bus bar 22 but may also be replaced by a pressing contact terminal formed at the tab 23b of the terminal 23.

As is clear from the foregoing description of the electrical connection construction between the electrical connection box and the electronic circuit unit, according to the first embodiment of the present invention, the tab of the terminal of the electronic circuit unit is formed into a shape similar to that of the tab of the electrical connection box and the pressing contact slit is formed at the distal end of one of the tabs of the electrical connection box and the electronic circuit unit, for example, the tab of the electrical connection box. Thus, the distal end portion of the tab of the electronic circuit unit is orthogonally inserted into the pressing contact slit of the tab of the electrical connection box so as to be connected to the tab of the electrical connection box.

Accordingly, since the tab and the pressing contact slit of the electrical connection box can be produced by conventional processes, production cost of the bus bar is not raised. Meanwhile, since the female electrical connector formed by bending with a press or the like is not required to be provided at the tab of the terminal of the electronic circuit unit, material cost and production cost of the terminal of the electronic circuit unit are lowered largely as compared with the terminal of the prior art electronic circuit unit.

Figure 14:
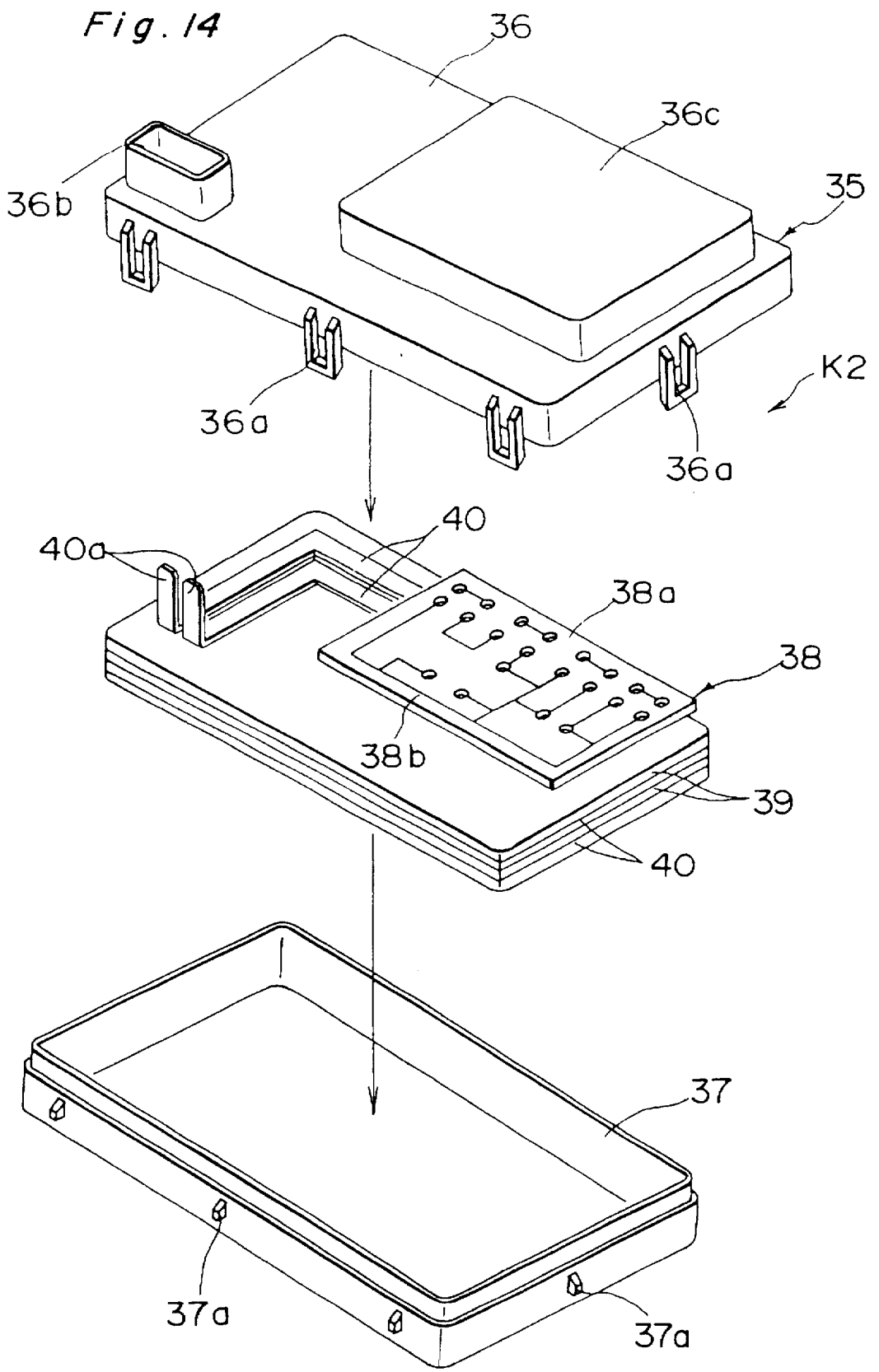
FIG. 14 is an exploded perspective view of an electrical connection construction between an electrical connection box and an electronic circuit unit, according to a second embodiment of the present invention.
Figure 19:
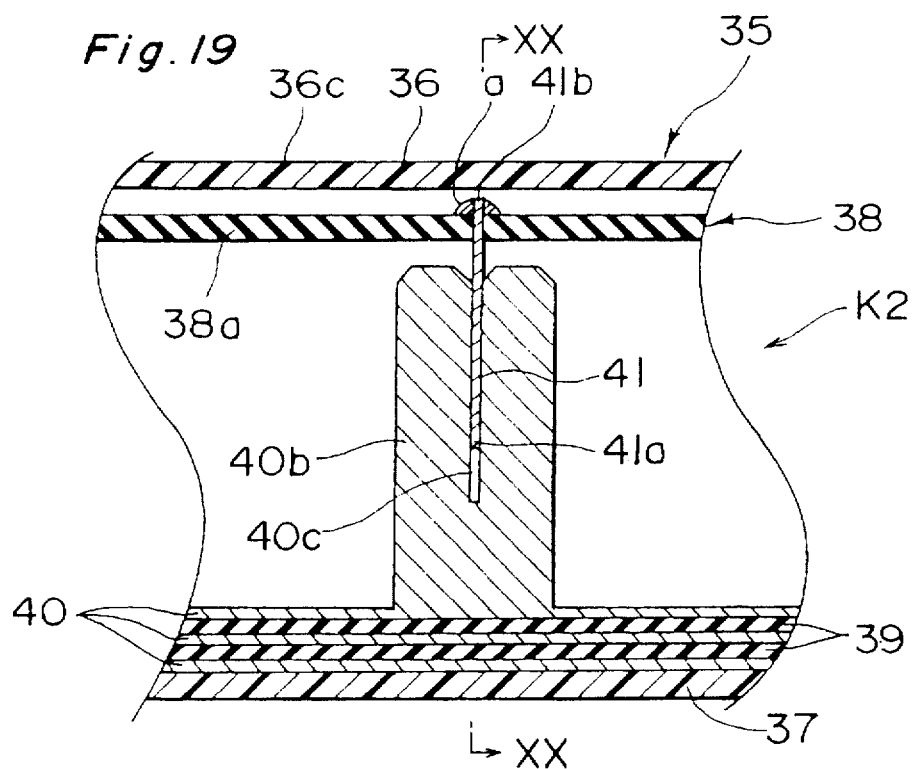
FIG. 19 is a fragmentary sectional view of the electrical connection construction of FIG. 14.

FIGS. 14 to 20 show an electrical connection construction K2 between an electrical connection box 35 and an electronic circuit unit 38, according to a second embodiment of the present invention. As shown in FIG. 14, the electrical connection box 35 includes a rectangular upper cover 36 and a rectangular lower cover 37, which are made of synthetic resin. The upper cover 36 is placed on the lower cover 37 and then, locking claws 37a of the lower cover 37 are brought into engagement with locking openings 36a of the upper cover 36, respectively such that the upper cover 36 is locked to the lower cover 37. A connector receiver 36b for receiving an external connector and a board receiver 36c for receiving a printed circuit board 38a of the electronic circuit unit 38 are projected from an upper face of the upper cover 36. As best shown in FIG. 19, a plurality of bus bars 40 are stacked on each other through a pair of insulating plates 39 in a space defined between the upper cover 36 and the lower cover 37. The bus bars 40 have two flat platelike tabs 40a provided for the external connector and projecting into the connector receiver 36b of the upper cover 36 and a plurality of flat platelike tabs 40b provided for the electronic circuit unit 38 and projecting into the board receiver 36c of the upper cover 36. A vertically extending pressing contact slit 40c is formed at a distal end of each of the tabs 40b.

Figure 4:
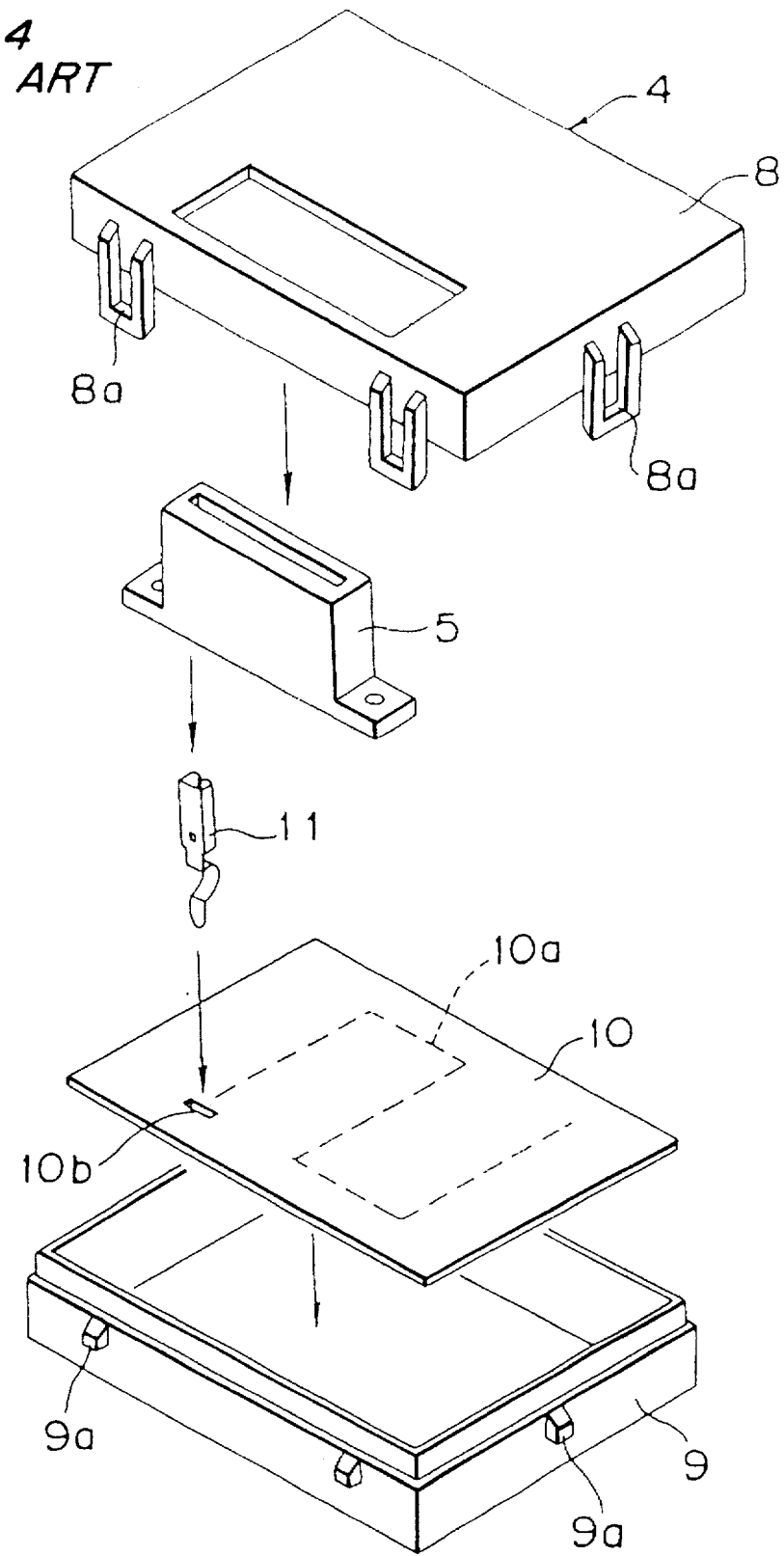
FIG. 4 is an exploded perspective view of the prior art electronic circuit unit of FIG. 1 (already referred to)
Figure 6:
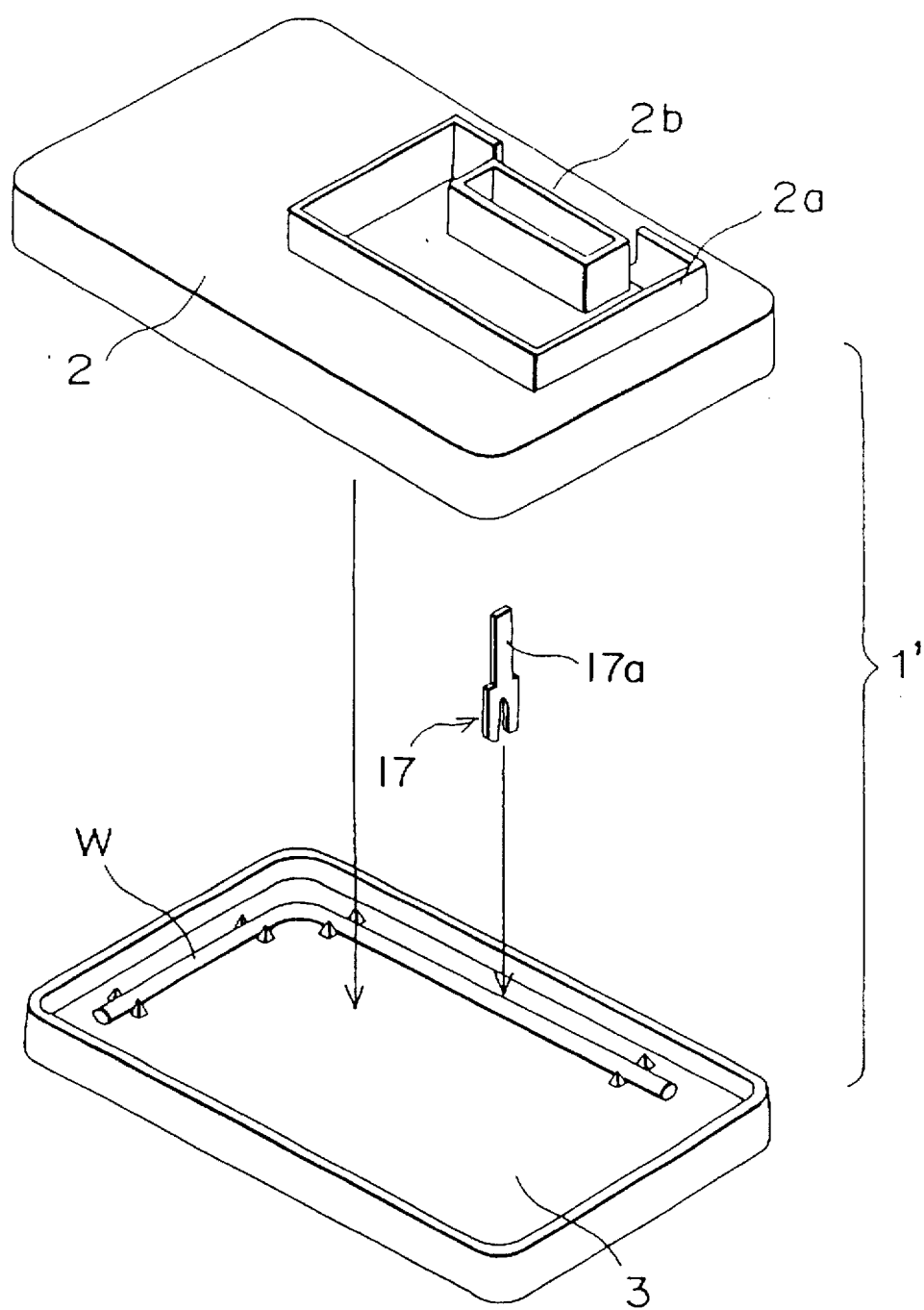
FIG. 6 is an exploded perspective view of another prior art electrical connection box (already referred to)
Figure 7:
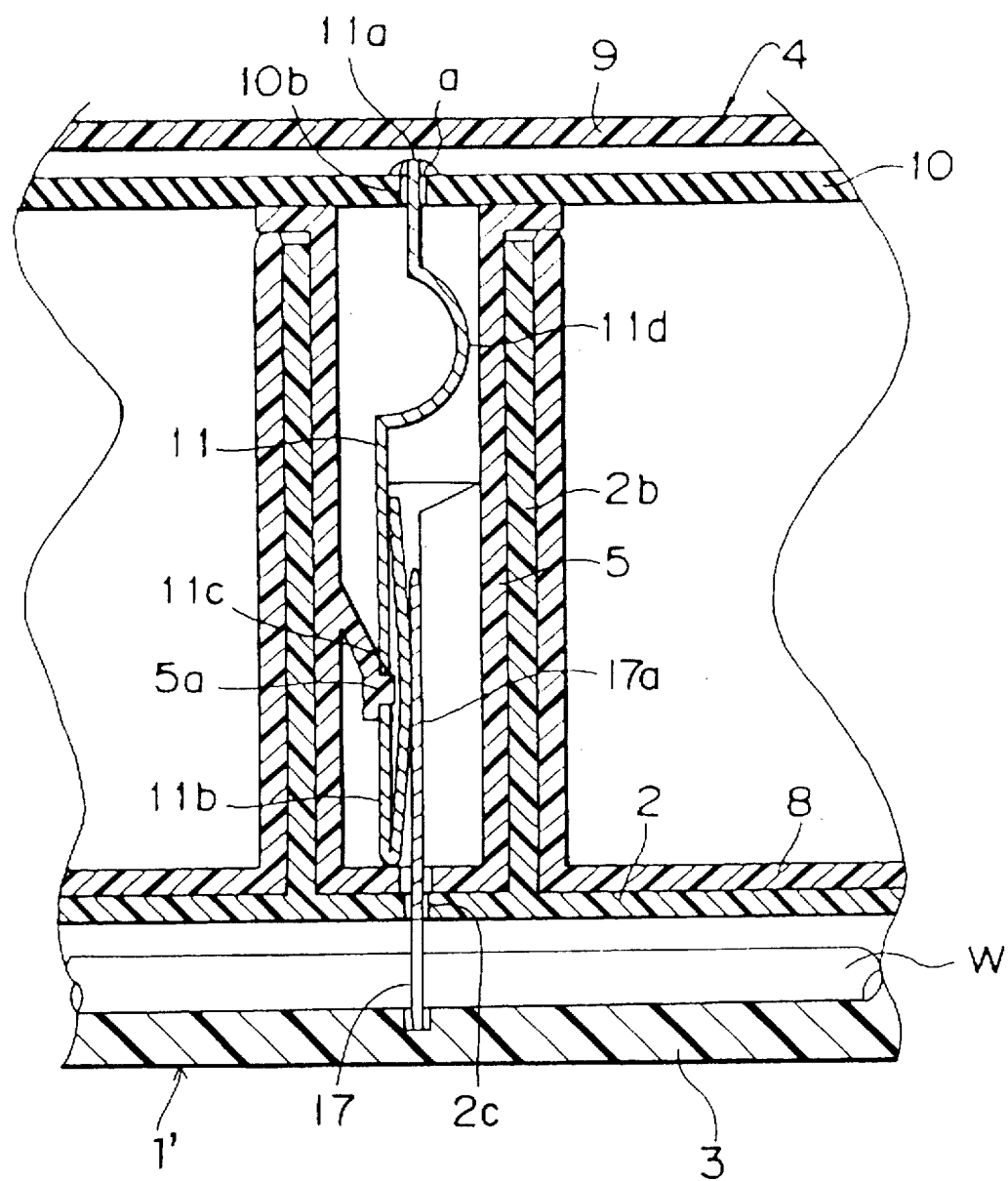
FIG. 7 is a fragmentary sectional view showing the prior art electrical connection box of FIG. 6 and the prior art electronic circuit unit of FIG. 1 after their connection (already referred to)
Figure 8:
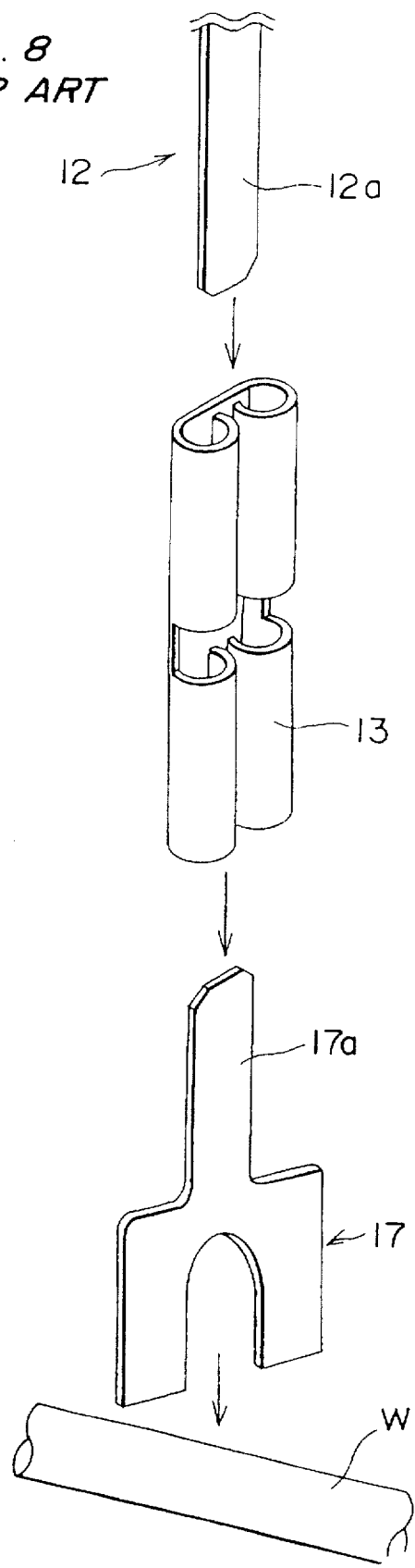
FIG. 8 is an exploded perspective view showing a configuration for connecting a pressing contact terminal of the prior art electrical connection box of FIG. 6 to a tab of an electrically conductive metal plate (already referred to)
Figure 9:
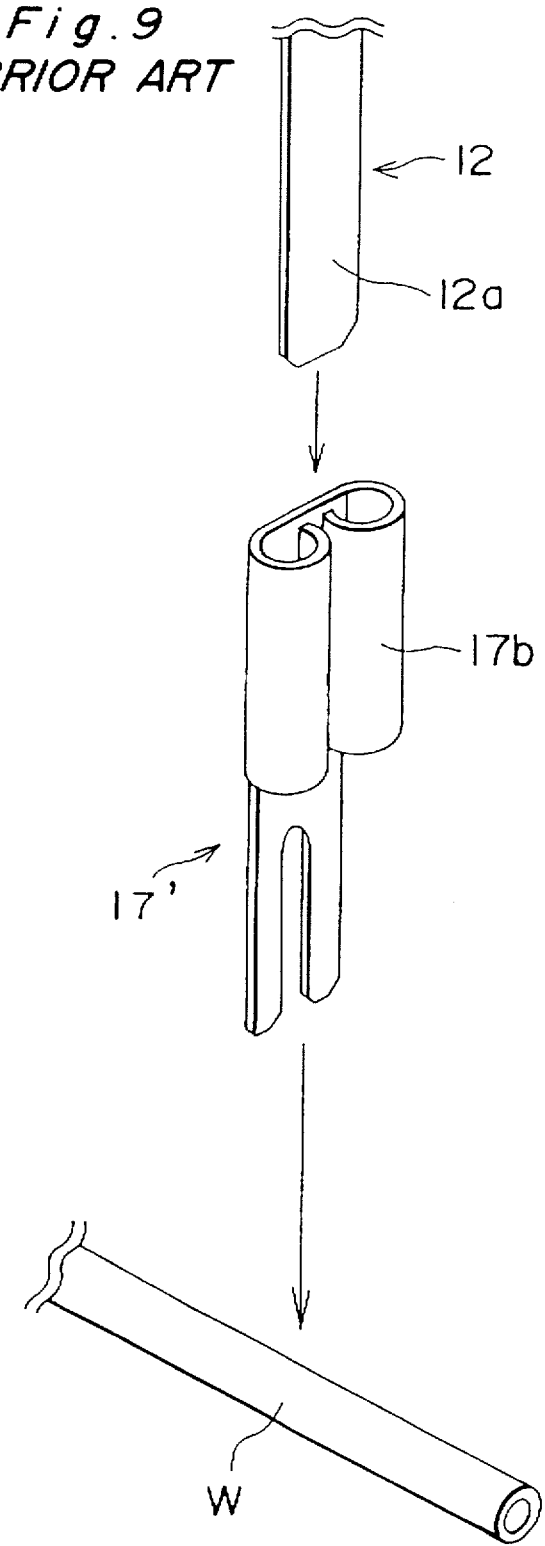
FIG. 9 is an exploded perspective view showing a configuration for connecting another prior art pressing contact terminal to the tab of the electrically conductive metal plate of FIG. 8 (already referred to)
Figure 16:
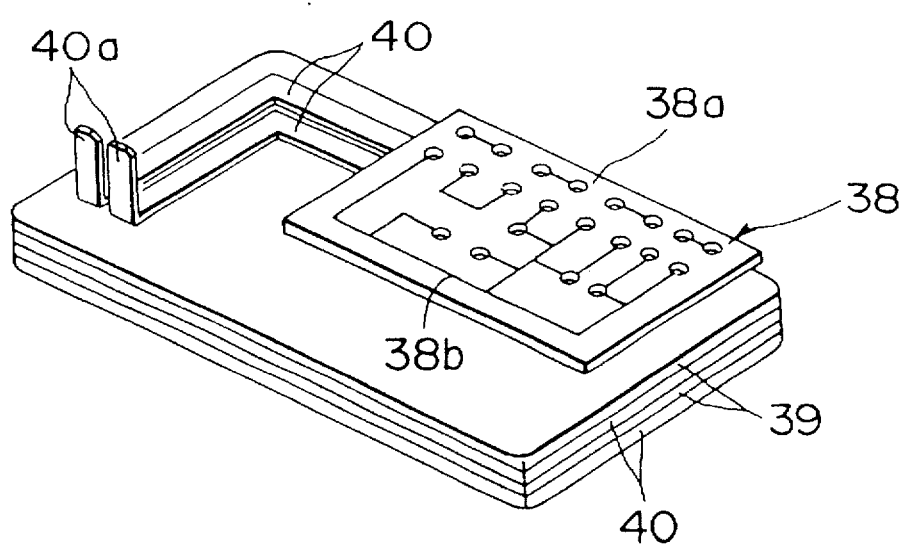
FIGS. 15 and 16 are perspective views showing states prior to and after insertion of tabs of terminals of a printed circuit board into pressing contact slits of tabs of bus bars in the electronic circuit unit of FIG. 14, respectively.

On the other hand, in contrast with a prior art outer mounting type electronic circuit unit 4 including an upper cover 8, a lower cover 9 and a printed circuit board 10 as shown in FIG. 4, the electronic circuit unit 38 is formed by only the printed circuit board 38a. As shown in FIG. 14, a circuit 38b is formed on an upper face of the printed circuit board 38a. When the electronic circuit unit 38 is turned upside down as shown by the arrow b in FIG. 15 and then, the electronic circuit unit 38 is disposed above the bus bars 40, a plurality of pairs of insertion holes 38c arranged at a predetermined interval in a lateral direction of the electrical connection box 35 are formed at proper locations of the circuit 38b confronting the tabs 40b of the bus bars 40 as shown in FIG. 16.

Figure 17:
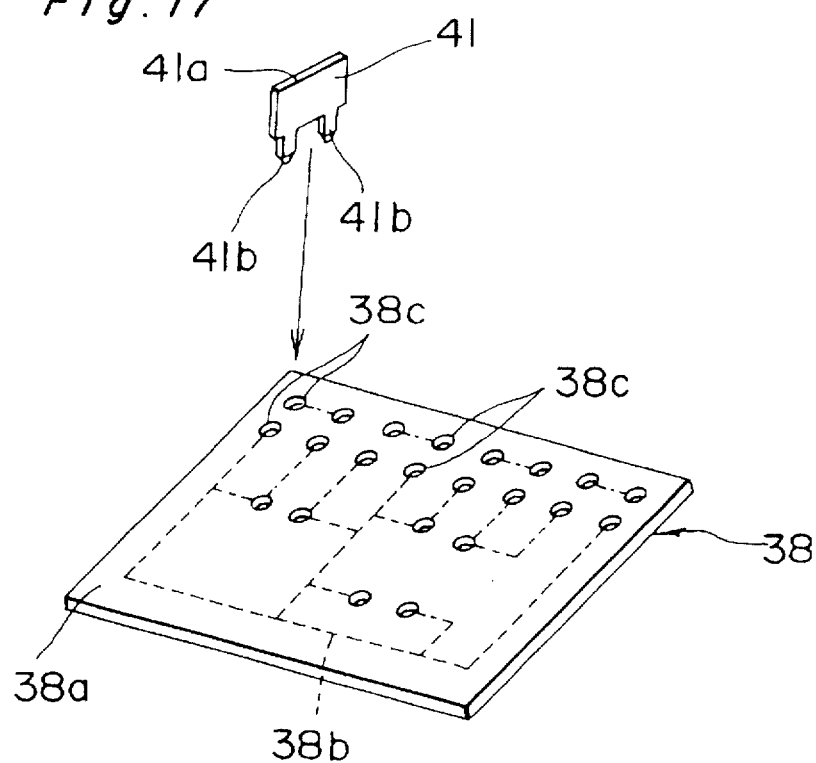
FIGS. 17 and 18 are perspective views showing states prior to and after bonding of the terminals to the printed circuit board of FIG. 15, respectively.
Figure 18:
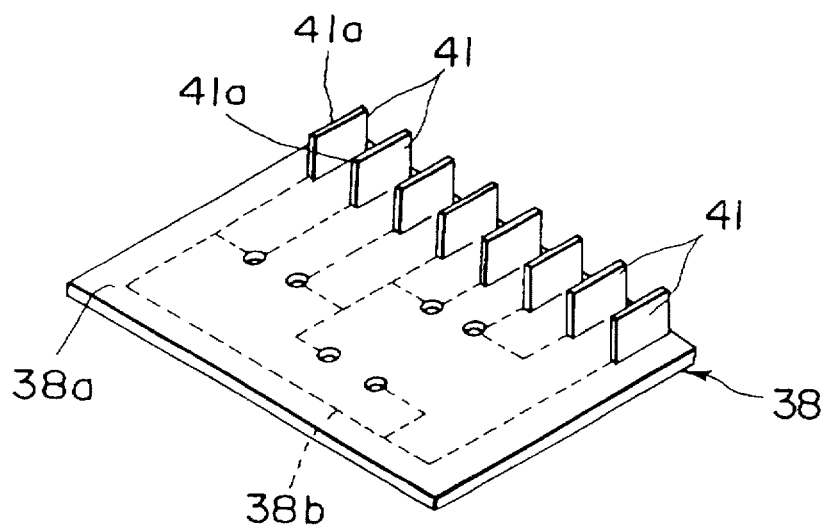
Figure 20:
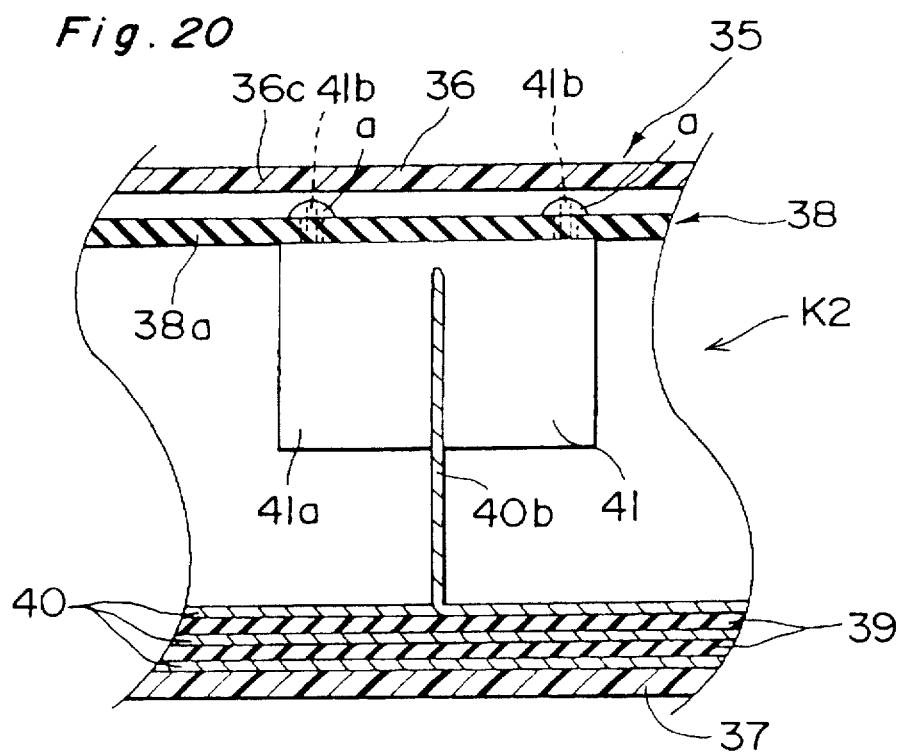
FIG. 20 is a fragmentary sectional view taken along the line XX—XX in FIG. 19.

In contrast with a prior art terminal 11 shown in FIG. 5, a female electrical connector obtained by bending with a press or the like is not formed at a front end of a terminal 41 which is joined to the printed circuit board 38a and a flat platelike tab 41a is formed at the front end of the terminal 41 in the same manner as the tab 40b of the bus bar 40. A pair of leg portions 41b are formed at a rear end of the terminal 41 so as to be inserted into each pair of the insertion holes 38c of the printed circuit board 38a. The leg portions 41b of the terminal 41 are, respectively, inserted into each pair of the insertion holes 38c from a lower face of the printed circuit board 38a in FIG. 14 as shown in FIG. 17 and are joined to the circuit 38b on the upper face of the printed circuit board 38a by solder a or the like as shown in FIGS. 19 and 20. Thus, each terminal 41 is so disposed as to orthogonally intersect with the tab 40b of the bus bar 40.

On the contrary, in case the circuit 38b is formed on the lower face of the printed circuit board 38a, the leg portions 41b of each terminal 41 may be joined to the circuit 38b on the lower face of the printed circuit board 38a by the solder a or the like. Soldering may also be replaced by ultrasonic welding or electric resistance welding.

Figure 15:
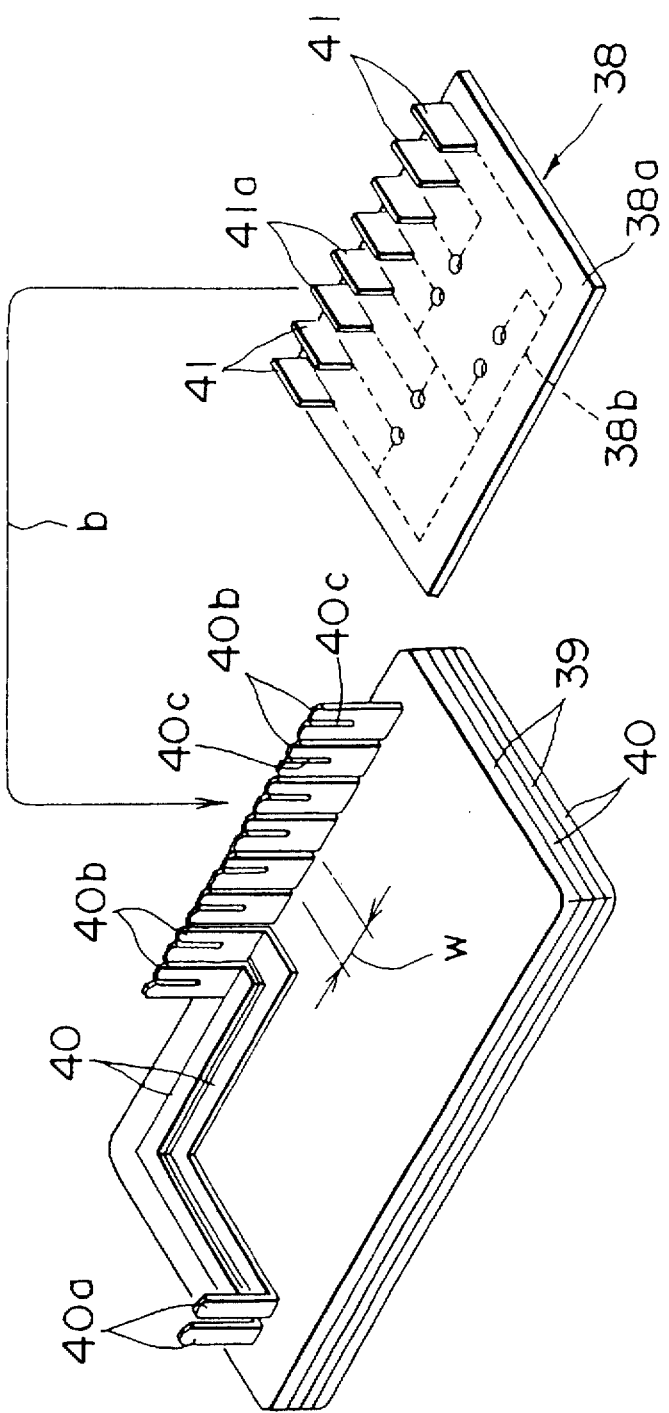

In the above mentioned electrical connection construction K2, when the printed circuit board 38a of the electronic circuit unit 38 is turned upside down as shown by the arrow b shown in FIG. 15 such that the terminals 41 are oriented downwardly and then, the printed circuit board 38a is placed on the bus bars 30 from above, the distal end of the tab 41a of each terminal 41 is orthogonally inserted into the pressing contact slit 40c of the tab 40b of each bus bar 40 so as to be connected to the tab 40b of each bus bar 40 as shown in FIGS. 19 and 20.

Subsequently, when the insulating plates 39 and the bus bars 40 stacked on each other are accommodated in the lower cover 37 together with the printed circuit board 38a of the electronic circuit unit 38 and then, the upper cover 36 is placed on the lower cover 37 so as to be locked to the lower cover 37, the tabs 40a of the bus bars 40 are projected into the connector receiver 36b of the upper cover 36 and the printed circuit board 38a of the electronic circuit unit 38 is accommodated in the board receiver 36c of the upper cover 36.

Since the tabs 40b and the pressing contact slits 40c of the bus bars 40 of the electrical connection box 35 can be produced by conventional processes, production cost of the bus bars 40 is not raised.

Meanwhile, in contrast with the female electrical connector 11b of the prior art terminal 11 shown in FIG. 5, since the tabs 41a of the terminals 41 of the electronic circuit unit 38 do not require bending with a press or the like, material cost and production cost of the terminals 41 are lowered as compared with the prior art terminal 11a. Furthermore, since the electronic circuit unit 38 is formed by only the printed circuit board 38a and is provided together with the bus bars 40 in the space defined between the upper cover 36 and the lower cover 37, the need for an upper cover 8, a lower cover 9, etc. provided in a prior art outer mounting type electronic circuit unit 4 shown in FIG. 4 is eliminated, so that the number of components of the electronic circuit unit 38 is reduced and thus, the number of assembly steps of the electronic circuit unit 38 also decreases, thereby resulting in sharp reduction of production cost of the electronic circuit unit 38.

In addition, since the two leg portions 41b of the terminal 41 are joined to the printed circuit board 38a of the electronic circuit unit 38, the terminal 41 can be brought into alignment with the pressing contact slit 40c of the tab 40b of the bus bar 40 and thus, a hitherto necessary connector housing 5 for bringing a terminal 11 into alignment with a tab 7a of a bus bar 7 as shown in FIGS. 1, 2 and 4 is not required to be provided.

In the above mentioned second embodiment of the present invention, the pressing contact slit 40c is formed at the tab 40b of the bus bar 40. However, a pressing contact slit may also be formed at the tab 41a of the terminal 41 in place of the pressing contact slit 40c.

As will be seen from the foregoing description of the electrical connection construction between the electrical connection box and the electronic circuit unit, according to the second embodiment of the present invention, the terminal of the electronic circuit unit has the tab similar to that of the bus bar of the electrical connection box and the distal end of one of the tabs of the electronic circuit unit and the electrical connection box, for example, the distal end of the tab of the electronic circuit unit is orthogonally inserted into the pressing contact slit formed at the distal end of the tab of the electrical connection box so as to be connected to the tab of the electrical connection box.

Therefore, since the tab and the pressing contact slit of the bus bar of the electrical connection box can be produced by conventional processes, production cost of the bus bar is not raised. Moreover, material cost and production cost of the tab of the terminal of the electronic circuit unit are reduced in comparison with the female electrical connector 11b obtained by bending with a press or the like in the prior art terminal 11 shown in FIG. 5.

Meanwhile, since the electronic circuit unit is formed by the printed circuit board, etc. and is provided together with the bus bars in the space defined between the upper cover and the lower cover of the electrical connection box, the electronic circuit unit does not require the upper cover 8 and the lower cover 9 of the prior art outer mounting type electronic circuit unit 4 shown in FIG. 4. As a result, since the number of components of the electronic circuit unit is reduced, the number of assembly steps of the electronic circuit unit is also reduced and thus, production cost of the electronic circuit unit is lowered greatly.

Furthermore, if the two leg portions of the terminal are joined to the printed circuit board of the electronic circuit unit by the solder or the like, the terminal of the electronic circuit unit can be brought into alignment with the pressing contact slit of the tab of the bus bar, so that the hitherto necessary connector housing for bringing the terminal into alignment with the tab of the bus bar is not required to be provided.

Figure 21:
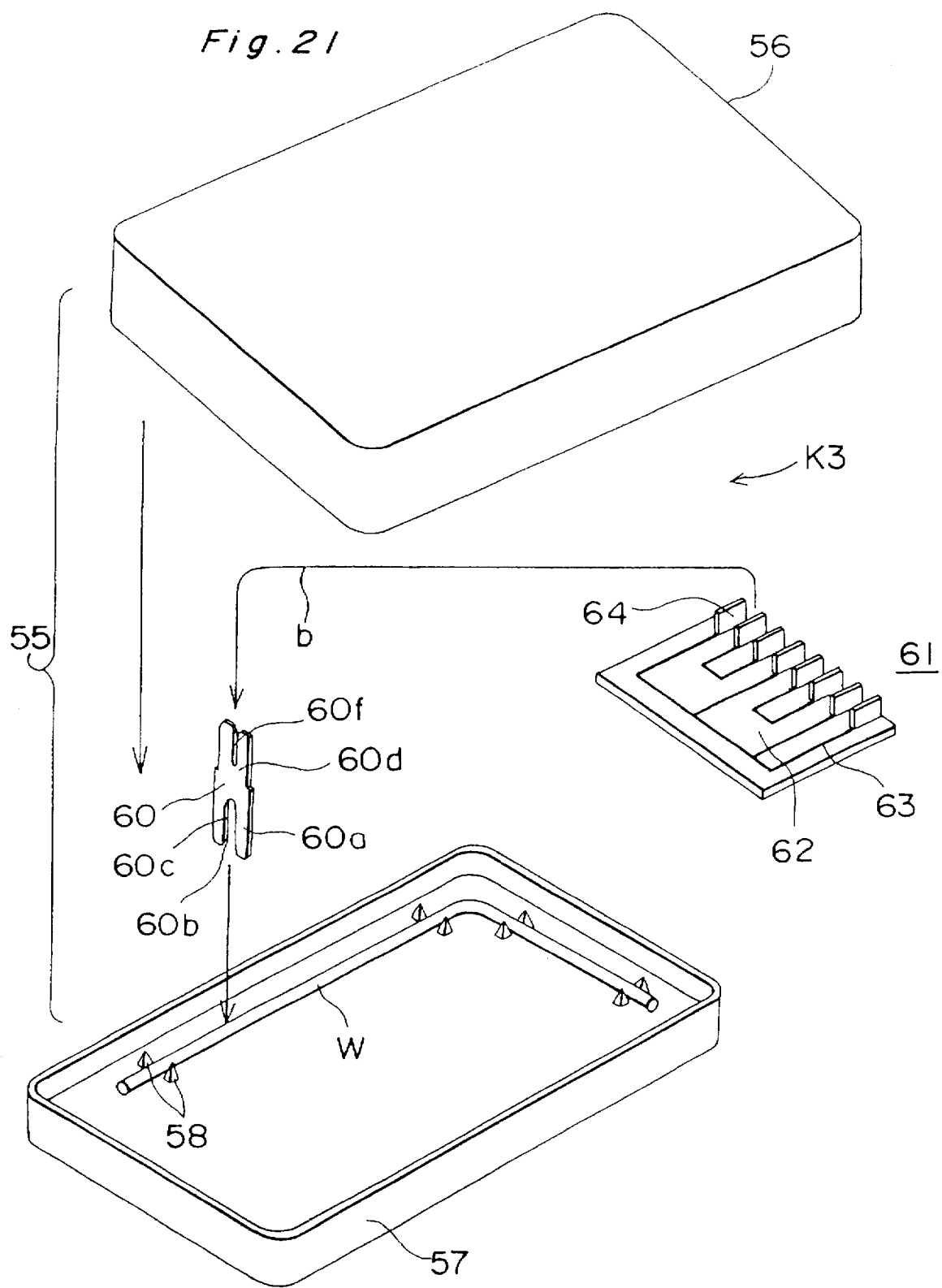
FIG. 21 is an exploded perspective view of an electrical connection construction between an electrical connection box and an electronic circuit unit, according to a third embodiment of the present invention.
Figure 22:
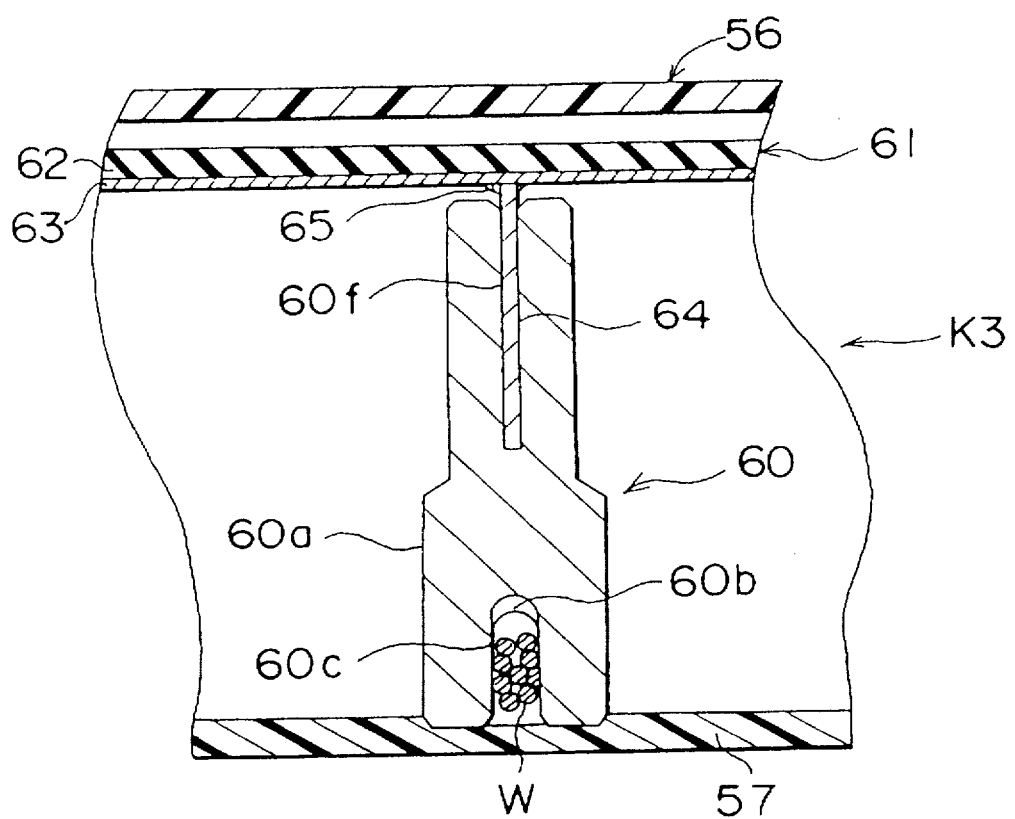
FIG. 22 is a sectional view showing an electrical connection state of the electrical connection construction of FIG. 21.

FIGS. 21 and 22 show an electrical connection construction K3 between an electrical connection box 55 and an electronic circuit unit 61, according to a third embodiment of the present invention. The electrical connection box 55 includes a rectangular upper casing 56 and a rectangular lower casing 57 which are made of synthetic resin. The upper casing 56 is placed on the lower casing 57 so as to be locked to the lower casing 57 such that a casing of the electrical connection box 55 is constituted by the upper casing 56 and the lower casing 57. A plurality of pairs of guide bosses 58 are provided at predetermined locations on an upper face of the lower casing 57 and a wire W is inserted between each pair of the guide bosses 58 so as to be laid along a predetermined path on the upper face of the lower casing 57. A plurality of pressing contact terminals 60 are driven into the wire W from above at predetermined locations of the wire W so as to be connected to a conductor of the wire W through pressing contact.

The pressing contact terminal 60 is formed by an electrically conductive metal plate and has a substantially flat platelike shape. A pressing contact portion 60a which is brought into pressing contact with the wire W is provided at a lower portion of the pressing contact terminal 60 and has a downwardly opening slot 60b. A pressing contact blade 60c is formed by peripheral edge of the slot 60b so as to be brought into pressing contact with the conductor of the wire W. A connective portion 60d which is connected to an external terminal is provided at an upper portion of the pressing contact terminal 60 and is formed by a flat platelike tab 60e. An upwardly opening pressing contact slit 60f is formed at a central portion of an upper end of the tab 60e.

A circuit of the electronic circuit unit 61 is arranged to be connected to the pressing contact terminal 60. The electronic circuit unit 61 is formed by only a printed circuit board 62 without the need for an upper cover 8 and a lower cover 9 provided for a prior art outer mounting type electronic circuit unit 4 shown in FIG. 4. As shown in FIGS. 21 and 22, a circuit 63 is formed on a lower face of the printed circuit board 62. Each of a plurality of electrically conductive metal pieces 64 each having a rectangular flat platelike shape is secured, at its lower end, to the lower face of the printed circuit board 62 by solder 65 so as to be connected to the circuit 63.

A thickness of the metal piece 64 is set such that the metal piece 64 can be brought into pressing contact with the pressing contact terminal 60 by inserting the metal piece 64 into the pressing contact slit 60f of the pressing contact terminal 60. Furthermore, the metal piece 64 is provided so as to orthogonally intersect with the pressing contact terminal 60 when the printed circuit board 62 is disposed above the pressing contact terminal 60 by turning the printed circuit board 62 upside down. Namely, the metal piece 64 fixed to the printed circuit board 62 is wholly formed into a flat platelike shape and is connected to the pressing contact slit 60f of the pressing contact terminal 60 at an arbitrary position. Thus, the metal piece 64 acting as a terminal for the electronic circuit unit 61 does not have a female electrical connector 11b formed by bending with a press or the like in a prior art terminal 11 shown in FIG. 5.

On the other hand, if the circuit 63 is formed on an upper face of the printed circuit board 62 as in FIG. 14, two leg portions are projected from a lower end of the metal piece 64 and a plurality of pairs of insertion holes are formed on the printed circuit board 62 in the same manner as FIG. 17. Thus, the leg portions of the metal piece 64 are inserted into each pair of the insertion holes from the lower face of the printed circuit board 62 and are soldered to the upper face of the printed circuit board 62 so as to be connected to the circuit 63 on the upper face of the printed circuit board 62.

In the above described electrical connection construction K3, when the printed circuit board 62 of the electronic circuit unit 61 is turned upside down as shown by the arrow b in FIG. 21 so as to orient the metal pieces 64 downwardly and then, is placed on the pressing contact terminal 60 from above, the distal end of the metal piece 64 of the printed circuit board 62 is orthogonally inserted into the pressing contact slit 60f of the pressing contact terminal 60 so as to be connected to the pressing contact terminal 60 as shown in FIG. 22. Subsequently, when the upper casing 56 is mounted on the lower casing 57, the electronic circuit unit 61 is mounted in the casing of the electrical connection box 55.

Figure 23:
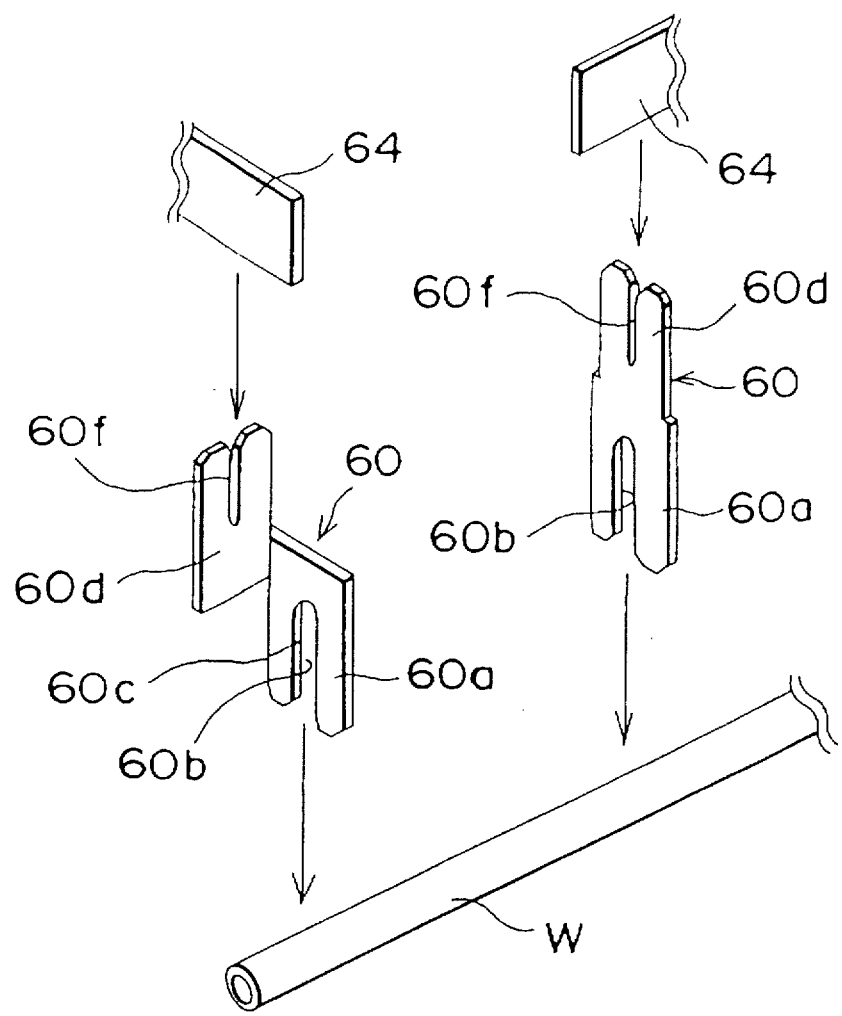
FIG. 23 is an exploded perspective view showing a modification of a pressing contact terminal employed in the electrical connection box of FIG. 21.

Meanwhile, a pressing contact terminal brought into pressing contact with the wire W is not limited to the pressing contact terminal 60 of FIG. 21. Thus, the pressing contact terminal 60 may also be replaced by a pressing contact terminal 70 shown in FIG. 23. In the pressing contact terminal 70, the connective portion 60d is provided at an upper portion of the pressing contact portion 60a so as to orthogonally intersect with the pressing contact portion 60a. When these pressing contact terminals 60 and 70 are used in combination so as to be brought into pressing contact with the wire W, directional degree of freedom of the metal pieces 64 fixed to the printed circuit board 62 of the electronic circuit unit 61 can be raised.

FIG. 24 shows an electrical connection construction K4 between the electrical connection box 55 whose internal circuit is constituted by the wire W and the pressing contact terminals 60 and an electrical connection box 80 to which bus bars 81 are attached, according to a fourth embodiment of the present invention. The electrical connection construction K4 is different from the electrical connection construction K3 in that the electronic circuit unit 61 of the electrical connection construction K3 is replaced by the electrical connection box 80. In contrast with a known electrical connection box in which a plurality of bus bars and a plurality of insulating plates are stacked on each other in an upper casing and a lower casing, the electrical connection box 80 includes an insulating plate 82 and a plurality of the bus bars 81. Each of the bus bars 81 is formed by an elongated rectangular electrically conductive metal plate and the bus bars 81 are fixed to an upper face of the insulating plate 82 at a predetermined interval so as to vertically stand on the upper face of the insulating plate 82 such that a pair of opposite sides of each of the bus bars 81 are oriented vertically.

A thickness of the bus bar 81 is set such that the bus bar 81 can be brought into pressing contact with the pressing contact terminal 60 by inserting the bus bar 81 into the pressing contact slit 60f of the pressing contact terminal 60. Namely, since the bus bar 81 is wholly formed into a flat platelike terminal, the bus bar 81 can be inserted into the pressing contact slit 60f at an arbitrary longitudinal position of the bus bar 81. Meanwhile, when the electrical connection box 80 is turned upside down as shown by the arrow b in FIG. 24 such that the bus bar 81 is connected to the pressing contact terminal 60, the bus bar 81 extends orthogonally to the pressing contact terminal 60.

When the electrical connection box 80 of the above described arrangement is assembled with the electrical connection box 55, the pressing contact terminal 60 connected to the wire W can be electrically connected to the bus bar 81 directly without a relay terminal in the same manner as the third embodiment. After the bus bars 81 of the electrical connection box 80 have been connected to the circuit constituted by the wire W and the pressing contact terminals 60 in the lower casing 57 of the electrical connection box 55, the upper casing 56 of the electrical connection box 55 is placed on the lower casing 57 so as to be locked to the lower casing 57. In this state, the electrical connection box 80 is accommodated in the electrical connection box 55.

Meanwhile, in the electrical connection box 80 provided with the bus bars 81, the bus bars 81 are projected from the insulating plate 82 in the fourth embodiment. However, the electrical connection box 80 may also be so modified as to include first bus bars accommodated in an upper casing and a lower casing and second bus bars provided on an outer face of the upper casing or the lower casing such that the first and second bus bars are connected to each other.

FIG. 25 shows an electrical connection construction K5 between the electrical connection box 55 and an electrical connection box 90, according to a fifth embodiment of the present invention. In the fourth embodiment, the bus bars 81 each formed by the elongated electrically conductive metal plate are provided so as to vertically stand on the insulating plate 82. On the other hand, in the fifth embodiment, a plurality of bus bars 93 are horizontally disposed on an upper face of the insulating plate 82 and a terminal portion 93a formed into a flat platelike tab is provided at a predetermined location of each bus bar 93 by bending the predetermined location of each bus bar 93 vertically. When the electrical connection box 90 is turned upside down as shown by the arrow b in FIG. 25 such that the terminal portion 93a of each bus bar 93 is inserted into the pressing contact terminal 60f of the pressing contact terminal 60, the terminal portion 93a is oriented orthogonally to the pressing contact terminal 60.

As is clear from the foregoing description of electrical connection box according to the third embodiment of the present invention, the connective portion of the pressing contact terminal brought into pressing contact with the wire is formed into the shape of the tab and the pressing contact slit is provided at the tab. Therefore, by providing the flat platelike terminal portion on the electrically conductive metal plate such as the bus bar so as to merely insert the terminal portion into the pressing contact slit, the electrically conductive metal plate can be directly connected to the pressing contact terminal. Accordingly, since the pressing contact terminal may be merely formed with the pressing contact slit, the pressing contact terminal can be produced by conventional processes and thus, production cost of the pressing contact terminal is not raised. Furthermore, in comparison with a prior art female terminal obtained by bending with a press or the like, material cost and production cost of the electrically conductive metal plate are reduced.

Meanwhile, when the electronic circuit unit is connected to the electrical connection box, a hitherto necessary female terminal portion is not required to be provided for the terminal connected to the circuit of the printed circuit board of the electronic circuit unit, so that production cost of the terminal can be lowered. Furthermore, since the printed circuit board can be accommodated in the electrical connection box, the electronic circuit unit does not require an upper cover and a lower cover in contrast with a conventional outer mounting type electronic circuit unit, so that the number of components of the electronic circuit unit is reduced and thus, the number of assembly steps of the electronic circuit unit also decreases, thereby resulting in sharp drop of production cost of the electronic circuit unit.

Also in case the electrical connection box having the internal circuit constituted by the wire and the pressing contact terminals and the electrical connection box having the circuit constituted by the bus bars are connected to each other, hitherto necessary relay terminals can be eliminated. Moreover, the female terminal portion which has been hitherto required to be provided for the pressing contact terminal in case the relay terminals are eliminated can also be eliminated. Meanwhile, a casing exclusively used for the circuit for the bus bars is not required to be provided.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An electrical connection construction between an electrical connection box and an electronic circuit unit, comprising:

a plurality of bus bars which are provided in the electrical connection box and each include a first tab; and a plurality of terminals which are soldered to the electronic circuit unit and a front end of each of which is inserted into a front end of the first tab of each of the bus bars of the electrical connection box so as to be connected to the first tab of each of the bus bars of the electrical connection box;

wherein the front end of each of the terminals is formed into a second tab and the first tab of each of the bus bars of the electrical connection box and the second tab of each of the terminals of the electronic circuit unit are provided so as to orthogonally intersect with each other;

wherein a pressing contact slit having straight parallel sides is formed at a front end of one of the first and second tabs so as to receive a front end of the other of the first and second tabs.

2. An electrical connection construction as claimed in claim 1, wherein the first tab of each of the bus bars is exposed outwardly from an opening of a cover of the electrical connection box and the second tab of each of the terminals is exposed outwardly from an opening of a cover of the electronic circuit unit.

3. An electrical connection construction as claimed in claim 2, wherein the pressing contact slit is formed at the front end of the first tab of each of the bus bars of the electrical connection box.

4. An electrical connection construction as claimed in claim 1, wherein the electronic circuit unit and the bus bars are provided in a space defined between an upper cover and a lower cover of the electrical connection box so as to be vertically spaced a predetermined distance from each other.

5. An electrical connection construction as claimed in claim 4, wherein the pressing contact slit is formed at the front end of the first tab of each of the bus bars of the electrical connection box.

6. An electrical connection construction as claimed in claim 4, wherein the electronic circuit unit is formed by a printed circuit board and a pair of leg portions are provided at a rear end of each of the terminals so as to be joined to a circuit formed on the printed circuit board.

7. An electrical connection construction as claimed in claim 5, wherein the electronic circuit unit is formed by a printed circuit board and a pair of leg portions are provided at a rear end of each of the terminals so as to be joined to a circuit formed on the printed circuit board.

8. An electrical connection construction as claimed in claim 6, wherein the leg portions of each of the terminals are joined to the circuit of the printed circuit board by solder.

9. An electrical connection construction as claimed in claim 7, wherein the leg portions of each of the terminals are joined to the circuit of the printed circuit board by solder.

10. An electrical connection construction between an electrical connection box and an electric device, comprising:

a first circuit which is provided for the electrical connection box; and a second circuit which is provided for the electric device so as to be connected to the first circuit;

wherein one of the first and second circuits is constituted by a wire and a plurality of pressing contact terminals brought into pressing contact with the wire, while the other of the first and second circuits is constituted by a plurality of electrically conductive metal plates such that the pressing contact terminals are connected to the electrically conductive metal plates, respectively;

wherein each of the pressing contact terminals has a tab to be connected to an external terminal and a pressing contact slit is formed at a front end of the tab;

wherein a flat platelike terminal portion is provided on each of the electrically conductive metal plates so as to orthogonally intersect with each of the pressing contact terminals and is inserted into the pressing contact slit of each of the pressing contact terminals so as to be connected to each of the pressing contact terminals.

11. An electrical connection construction as claimed in claim 10, wherein the electric device is formed by an electronic circuit unit and the second circuit of the electronic circuit unit is constituted by the electrically conductive metal plates fixed to and projecting from a circuit formed on a printed circuit board of the electronic circuit unit.

12. An electrical connection construction as claimed in claim 10, wherein the electric device is formed by a further electrical connection box and the second circuit of the further electrical connection box is constituted by a plurality of bus bars such that the flat platelike terminal portion is provided on each of the bus bars.

13. An electrical connection construction between an electrical connection box and an electronic circuit unit, comprising:

a plurality of bus bars, provided in said electrical connection box, each of said plurality of bus bars including a first tab;

a plurality of terminals, provided in said electronic circuit unit, a front end of each of said plurality of terminals being inserted into a front end of a first tab of each of said plurality of bus bars;

wherein said front end of each of said terminals has a second tab, said first tab of each of said plurality of bus bars and said second tab of each of said plurality of terminals orthogonally intersecting;

wherein a pressing contact slit is formed at a front end of said first tab of each of said plurality of bus bars to receive a corresponding front end of said second tab; and wherein said first tab of each of said plurality of bus bars is exposed outwardly from an opening of a cover of said electrical connection box, and said second tab of each of said terminals is exposed outwardly from an opening of a cover of said electronic circuit unit.

14. An electrical connection construction between an electrical connection box and an electronic circuit unit, comprising:

a plurality of bus bars, provided in said electrical connection box, each of said plurality of bus bars including a first tab;

a plurality of terminals, provided in said electronic circuit unit, a front end of each of said plurality of terminals being inserted into a front end of a first tab of each of said plurality of bus bars;

wherein said front end of each of said terminals has a second tab, said first tab of each of said plurality of bus bars and said second tab of each of said plurality of terminals orthogonally intersecting;

wherein a pressing contact slit is formed at a front end of said first tab of each of said plurality of bus bars to receive a corresponding front end of said second tab; and wherein said electronic circuit unit and said plurality of bus bars are provided in a space defined between an upper cover and a lower cover of said electrical connection box so as to be vertically spaced at a predetermined distance from each other.

15. The electrical connection construction of claim 14, wherein said electronic circuit unit is formed by a printed circuit board and a pair of leg portions provided at a rear end of each of said plurality of terminals to connect to a circuit formed on said printed circuit board.

16. An electrical connection construction according to claim 15, wherein said leg portions of each of said plurality of terminals are joined to the circuit of said printed circuit board through solder.

17. An electrical connection construction between an electrical connection box and an electric device, comprising:

a first circuit provided for the electrical connection box;

a second circuit provided for said electronic device to connect to said first circuit; and wherein one of said first and second circuits includes a wire and a plurality of pressing contact terminals brought into pressing contact with said wire, while the other of said first and second circuits includes a plurality of electrically conductive metal plates such that said pressing contact terminal are connected to said electrically conductive metal plates, respectively;

wherein each of said pressing contact terminals has a tab connected to an external terminal and a pressing contact slit formed at a front end of said tab;

wherein a flat platelike terminal portion is provided on each of said electrically conductive metal plates to orthogonally intersect with said pressing contact slit of each of said pressing contact terminals; and wherein said electrical device is formed by a further electrical connection box, and said second circuit of said further connection box includes a plurality of bus bars such that said flat platelike terminal portion is provided on each of said plurality of bus bars.

18. An electrical connection construction according to claim 17, wherein said electronic device is an electronic circuit unit, said second circuit of said electronic circuit unit is said electrically conductive metal plates fixed to, and projecting from, a circuit formed on a printed circuit board of said electronic circuit unit.

* * * * *